(12) United States Patent
Hanawa

(10) Patent No.: US 10,043,884 B2
(45) Date of Patent: *Aug. 7, 2018

(54) MANUFACTURING METHOD FOR SEMICONDUCTOR DEVICE

(71) Applicant: Renesas Electronics Corporation, Koutou-ku, Tokyo (JP)

(72) Inventor: Toshikazu Hanawa, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/672,097

(22) Filed: Aug. 8, 2017

(65) Prior Publication Data

US 2017/0338324 A1    Nov. 23, 2017

Related U.S. Application Data

(63) Continuation of application No. 15/177,337, filed on Jun. 8, 2016, now Pat. No. 9,761,685.

(30) Foreign Application Priority Data

Aug. 20, 2015 (JP) .................. 2015-162873

(51) Int. Cl.
| | |
|---|---|
| *H01L 21/331* | (2006.01) |
| *H01L 29/66* | (2006.01) |
| *H01L 21/02* | (2006.01) |
| *H01L 29/423* | (2006.01) |
| *H01L 29/417* | (2006.01) |

(Continued)

(52) U.S. Cl.
CPC .. *H01L 29/66295* (2013.01); *H01L 21/02238* (2013.01); *H01L 21/02255* (2013.01); *H01L 21/266* (2013.01); *H01L 21/31111* (2013.01); *H01L 21/31116* (2013.01); *H01L 29/0804* (2013.01); *H01L 29/1004* (2013.01);

(Continued)

(58) Field of Classification Search
CPC ............ H01L 29/66295; H01L 29/732; H01L 21/31111; H01L 21/266; H01L 29/1004; H01L 21/31116; H01L 29/0804; H01L 29/41708; H01L 21/02238; H01L 29/42304; H01L 21/02255
USPC ........................................ 438/369
See application file for complete search history.

(56) References Cited

U.S. PATENT DOCUMENTS

| | | | | |
|---|---|---|---|---|
| 6,033,990 A | * | 3/2000 | Kishimoto | ........ H01L 21/02063 257/E21.252 |
| 6,730,986 B2 | | 5/2004 | Park | |

(Continued)

FOREIGN PATENT DOCUMENTS

| | | |
|---|---|---|
| JP | 5-90220 A | 4/1993 |
| JP | 10-116815 A | 5/1998 |

*Primary Examiner* — Vu A Vu
(74) *Attorney, Agent, or Firm* — Shapiro, Gabor and Rosenberger, PLLC

(57) ABSTRACT

Provided is a method for manufacturing a semiconductor device that improves the reliability of the semiconductor device. An opening is formed in an insulating film formed over a semiconductor substrate. At that time, a mask layer for formation of the opening is formed over the insulating film. The insulating film is dry etched and then wet etched. The dry etching step is finished before the semiconductor substrate is exposed at the bottom of the opening, and the wet etching step is finished after the semiconductor substrate is exposed at the bottom of the opening.

20 Claims, 17 Drawing Sheets

(51) Int. Cl.
*H01L 29/08* (2006.01)
*H01L 29/10* (2006.01)
*H01L 21/266* (2006.01)
*H01L 21/311* (2006.01)
*H01L 29/732* (2006.01)

(52) U.S. Cl.
CPC .. *H01L 29/41708* (2013.01); *H01L 29/42304* (2013.01); *H01L 29/732* (2013.01)

(56) References Cited

U.S. PATENT DOCUMENTS

| | | |
|---|---|---|
| 6,869,854 B2 | 3/2005 | Cantell et al. |
| 7,064,042 B1 | 6/2006 | Ahmed et al. |
| 7,190,012 B2 * | 3/2007 | Son .................. H01L 31/02168 257/E27.133 |
| 7,399,707 B2 | 7/2008 | Krishnaraj et al. |
| 7,476,598 B2 | 1/2009 | Son et al. |
| 9,761,685 B2 * | 9/2017 | Hanawa ............ H01L 29/66295 |
| 2007/0126082 A1 | 6/2007 | Bairo |
| 2012/0154346 A1 | 6/2012 | Hirose |

* cited by examiner

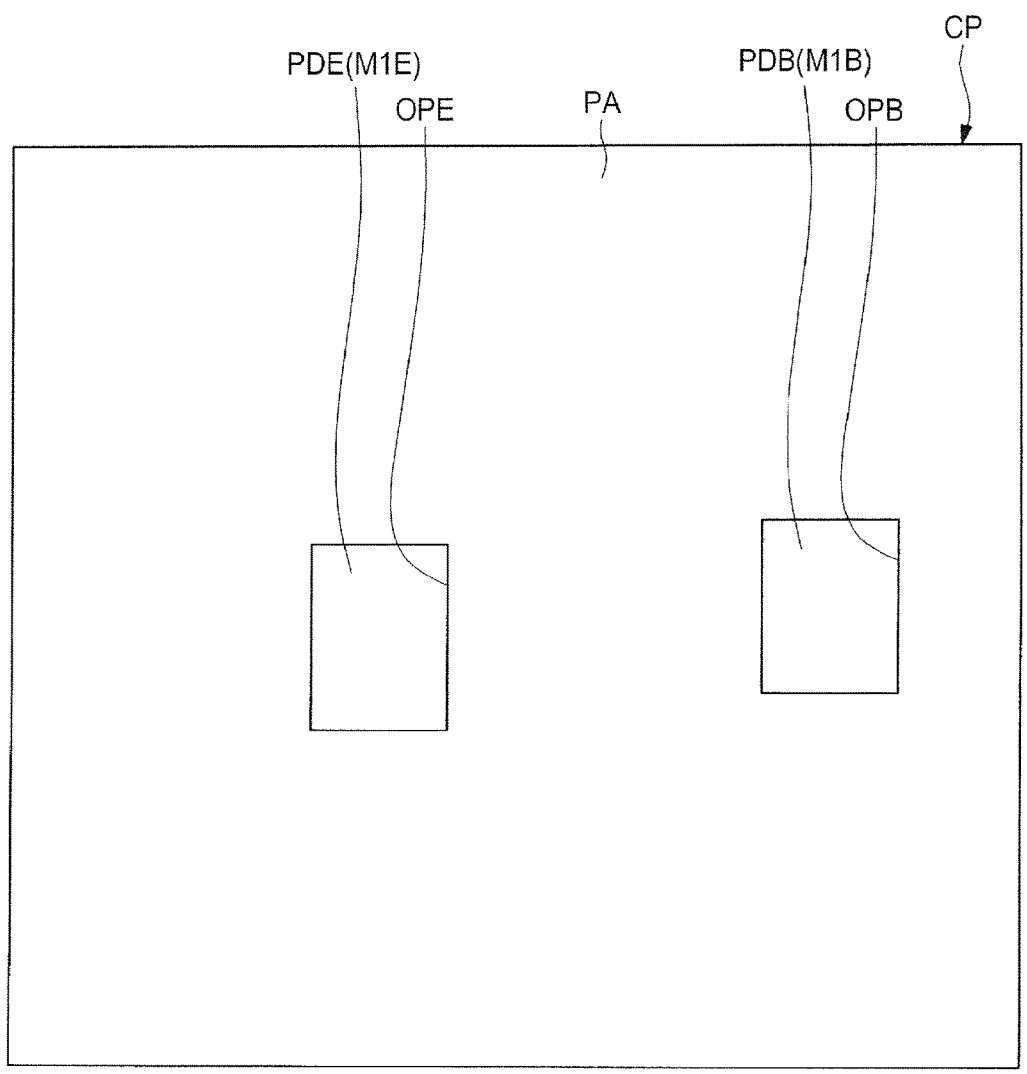

MANUFACTURING METHOD FOR SEMICONDUCTOR DEVICE

CROSS-REFERENCE TO RELATED APPLICATIONS

The disclosure of Japanese Patent Application No. 2015-162873 filed on Aug. 20, 2015 including the specification, drawings and abstract is incorporated herein by reference in its entirety.

BACKGROUND

The present invention relates to a manufacturing method for a semiconductor device, and more specifically, a technique suitable for use in a method for manufacturing a semiconductor device that includes a step of forming an opening in an insulating film.

When manufacturing a semiconductor device, an opening is formed in an insulating film formed over a semiconductor substrate in some cases.

Japanese Unexamined Patent Application Publication No. Hei 10(1998)-116815 (Patent Document 1) and Japanese Unexamined Patent Application Publication No. Hei 05(1993)-90220 (Patent Document 2) disclose a technique for forming a contact hole in an interlayer insulating film.

RELATED ART LIST

Parent Documents

Patent Document 1: Japanese Unexamined Patent Application Publication No. Hei 10(1998)-116815
Patent Document 2: Japanese Unexamined Patent Application Publication No. Hei 05(1993)-90220

SUMMARY

When forming an opening in an insulating film formed over a semiconductor substrate, the semiconductor substrate might be damaged, thus reducing the reliability of a semiconductor device finally produced. Furthermore, when forming the opening in the insulating film formed over the semiconductor substrate, the shape or size of the formed opening might deviate from its designed value, also possibly reducing the reliability of the semiconductor device finally produced.

Other problems and new features of the present invention will be clarified from the description of the present specification and the accompanied drawings.

According to one embodiment, when forming an opening in an insulating film formed over a semiconductor substrate, a mask layer for formation of the opening is formed over the insulating film, and the insulating film is then dry etched, followed by wet etching. The dry etching step is finished before the semiconductor substrate is exposed at a bottom of the opening, and the wet etching step is finished after the semiconductor substrate is exposed at the bottom of the opening.

The one embodiment can improve the reliability of the semiconductor device.

BRIEF DESCRIPTION OF THE DRAWINGS

FIG. 29 is another plan view showing the one example of the semiconductor device in the one embodiment.

DETAILED DESCRIPTION

Figure 1:
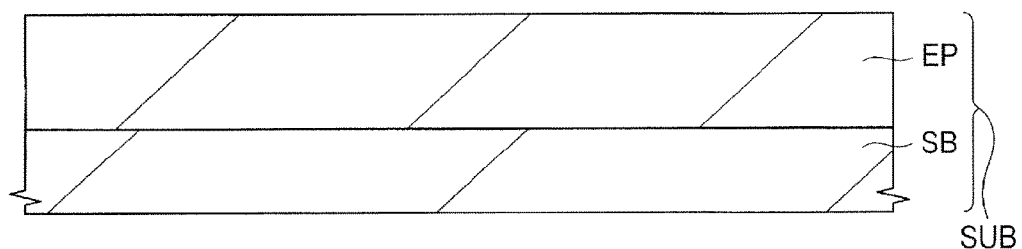
FIG. 1 is a cross-sectional view of a main part in a manufacturing step for a semiconductor device according to one embodiment.

The following preferred embodiments may be described by being divided into a plurality of sections or embodiments for convenience as appropriate, which are not independent from each other, unless otherwise specified. One of the sections or embodiments may be a modified example, a detailed description, supplementary explanation, and the like of a part or all of the other. Even when referring to a specific number about an element and the like (including the number of elements, a numerical value, an amount, a range, and the like) in the embodiments below, the invention is not limited to the specific number, and may take the number greater than, or less than the specific numeral number, unless otherwise specified, and except when obviously limited to the specific number in principle. The components (including elements and steps) in the embodiments below are not necessarily essential unless otherwise specified and except when clearly considered to be essential in principle. Likewise, when referring to the shape of one component, the positional relationship between the components and the like in the following embodiments, any shape or positional relationship substantially similar or approximate to that described herein may be included in the invention unless otherwise specified and except when clearly considered not to be so in principle. The same goes for the above numerical value and the range.

Embodiments of the invention will be described in detail below with reference to the accompanying drawings. In all drawings for explaining the embodiments, parts having the same function are denoted by the same reference character, and the repeated description thereof will be omitted. In the embodiments below, the description of the same or similar parts will not be repeated in principle, except when needed.

In the accompanying drawings used in the embodiments, even some cross-sectional views may omit hatching for better understanding. Further, some plan views are provided with hatching to make the drawings understood easily.

Embodiments

<Manufacturing Steps for Semiconductor Device>

Manufacturing steps for a semiconductor device according to this embodiment will be described below with reference to the accompanying drawings. FIGS. 1 to 24 are cross-sectional views of main parts in the manufacturing steps for the semiconductor device in this embodiment. The semiconductor device of this embodiment includes a bipolar transistor.

As shown in FIG. 1, first, a substrate main body SB is provided (prepared). The substrate main body SB is a semiconductor substrate made of, for example, an n-type single-crystal silicon into which n-type impurities, such as phosphorus (P) or arsenic (As), are introduced.

Then, an epitaxial layer (semiconductor layer, epitaxial semiconductor layer) EP is formed over a main surface of the substrate main body SB. Thus, a semiconductor substrate SUB is formed to include the epitaxial layer EP over the main surface of the substrate main body SB. The epitaxial layer EP is a semiconductor layer that can be formed by an epitaxial growth method from an n$^-$-type single-crystal silicon and the like into which n-type impurities, such as phosphorus (P) or arsenic (As), are introduced.

The semiconductor substrate SUB is the so-called epitaxial wafer, and has the substrate main body SB and the epitaxial layer EP formed over the main surface of the substrate main body SB. The substrate main body SB and the epitaxial layer EP have the same conduction type (here, n-type), but the concentration of impurities in the epitaxial layer EP (n-type impurity concentration) is lower than that in the substrate main body SB (n-type impurity concentration). The epitaxial layer EP is formed over the entire main surface of the substrate main body SB.

Figure 2:
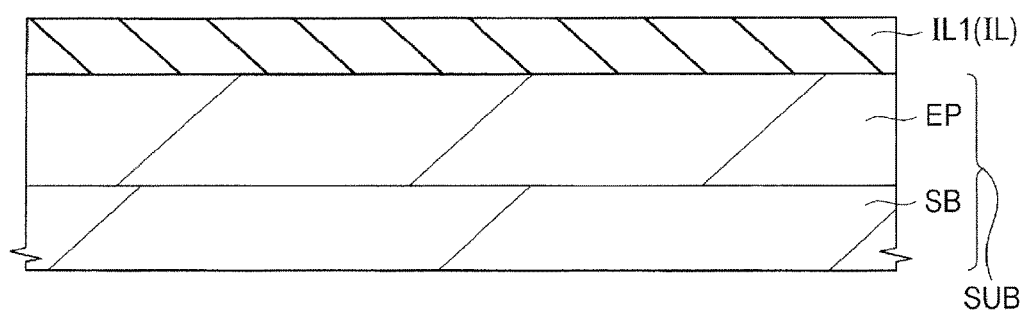
FIG. 2 is a cross-sectional view of a main part in another manufacturing step for the semiconductor device following the step shown in FIG. 1.

Then, as shown in FIG. 2, an insulating film IL1 is formed over the main surface of the semiconductor substrate SUB, that is, over the main surface of the epitaxial layer EP. The insulating film IL1 is made of a silicon oxide film or the like, and can be formed, for example, by a thermal oxidation method. When forming the insulating film IL1 by the thermal oxidation method, a surface layer part of the epitaxial layer EP is thermally oxidized to thereby form the insulating film IL1 made of an oxide film.

Then, a step of forming an opening OP1 in the insulating film IL1 is performed. The formation step of the opening OP1 includes a first etching step of dry etching and a second etching step of wet etching. Now, the formation step of the opening OP1 will be specifically described.

Figure 3:
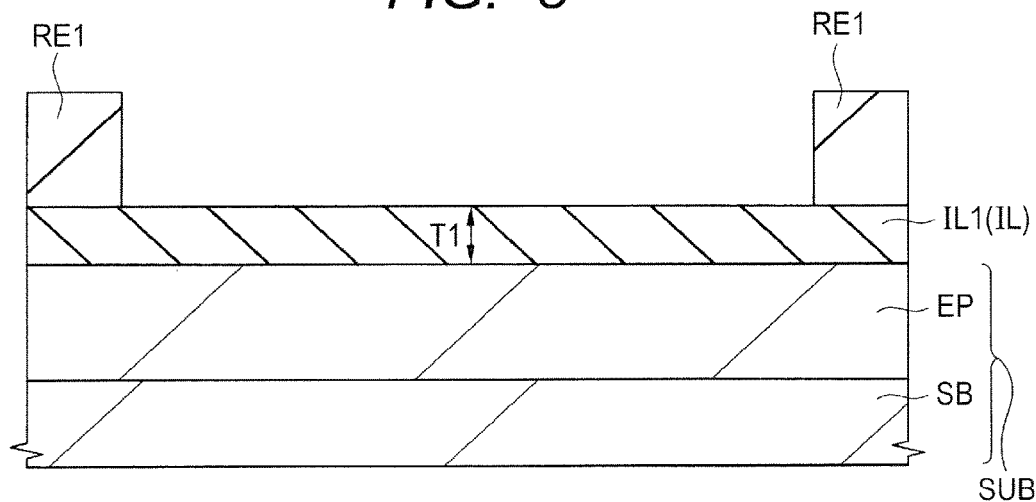
FIG. 3 is a cross-sectional view of a main part in another manufacturing step for the semiconductor device following the step shown in FIG. 2.

First, as shown in FIG. 3, a resist pattern (photoresist pattern) RE1 is formed over the insulating film IL1 as a mask layer (etching mask layer) using a photolithography technique. The resist pattern RE1 serves as the mask layer for formation of the opening OP1. The resist pattern RE1 has an opening in a region where the opening OP1 is to be formed, that is, in a region where a p-type semiconductor region PR is to be formed as described later.

Note that the photolithography technique is a technique for forming a resist pattern (photoresist pattern) by forming a resist layer (photoresist layer) by a coating method and the like, and then exposing the resist layer to light, followed by development.

Figure 4:
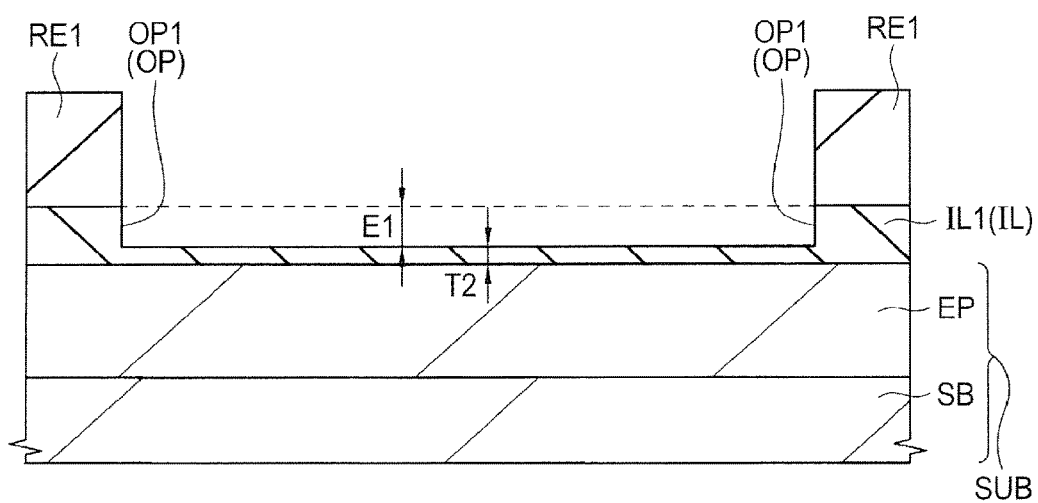
FIG. 4 is a cross-sectional view of a main part in another manufacturing step for the semiconductor device following the step shown in FIG. 3.

Then, as shown in FIG. 4, in the first etching step, the insulating film IL1 is dry etched using the resist pattern RE1 as a mask (etching mask). FIG. 4 shows the stage in which the first etching step is finished, but represents the position of a surface of the insulating film IL1 immediately before the first etching step by a dotted line for easier understanding.

In the first etching step, a part of the insulating film IL1 not covered with and exposed from the resist pattern RE1 is dry etched to thereby form the opening OP1 in the insulating film IL1. The opening OP1 is formed in alignment with the opening of the resist pattern RE1.

The first etching step is finished before the epitaxial layer EP is exposed at the bottom of the opening OP1. In other words, the amount of etching (etching thickness) E1 of the insulating film IL1 in the first etching step is smaller than a film thickness (initial film thickness) T1 of the insulating film IL1 provided immediately before the first etching step. That is, the relationship of E1<T1 is satisfied. Thus, in the stage where the first etching step is finished, the opening OP1 does not pass through the insulating film IL1, and the insulating film IL1 remains in the form of layer at the bottom of the opening OP1 without permitting the epitaxial layer EP to be exposed therefrom. Here, the film thickness T1 is defined as a thickness of the insulating film IL1 in a region where the opening OP1 is to be formed immediately before the first etching step.

When referring to the "etching amount" of one film in this embodiment, it means how much the film is etched in the direction of its thickness (in the direction substantially vertical to the main surface of the semiconductor substrate SUB). In this way, the term "etching amount" as used herein has the same meaning as the term "etching thickness (etched thickness)". Therefore, the "etching amount" of one film corresponds to a difference in thickness of the film between before and after the etching (see FIG. 4 and the like).

Figure 5:
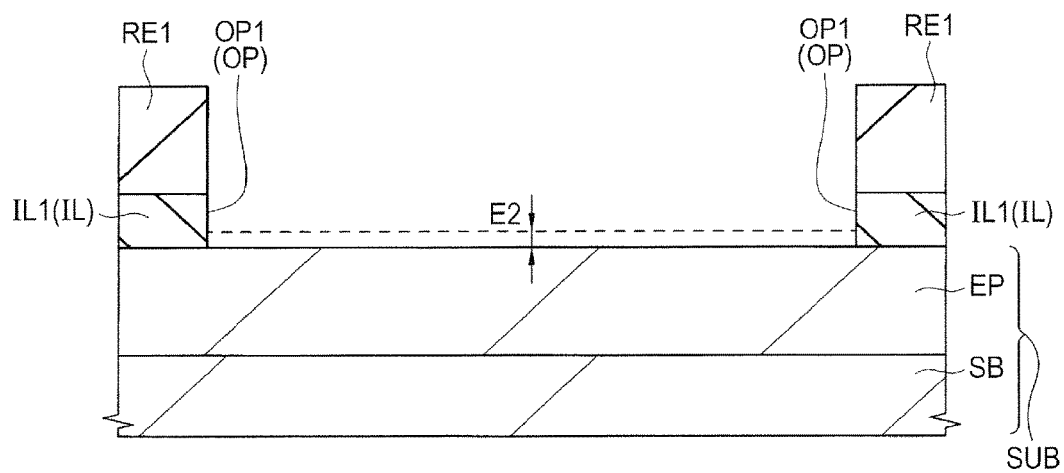
FIG. 5 is a cross-sectional view of a main part in another manufacturing step for the semiconductor device following the step shown in FIG. 4.

Then, as shown in FIG. 5, in the second etching step, the insulating film IL1 is wet etched using the resist pattern RE1 as a mask (etching mask). FIG. 5 shows the stage in which the second etching step is finished, but represents the position of a surface of the insulating film IL1 immediately before the second etching step by a dotted line for easier understanding.

In the second etching step, a part of the insulating film IL1 not covered with and exposed from the resist pattern RE1 is wet etched, whereby the insulating film IL1 exposed at the bottom surface and the side surfaces of the opening OP1 is exposed to an etchant to be etched. The second etching step is finished after the epitaxial layer EP is exposed at the bottom of the opening OP1. Thus, in the stage where the second etching step is finished, the opening OP1 passes through the insulating film IL1 with the surface of the epitaxial layer EP exposed at the bottom of the opening OP1. In the stage where the first etching step is finished, the opening OP1 does not form a through hole but makes a recessed portion, whereas in the stage where the second etching step is finished, the opening OP1 forms a through hole.

Accordingly, the etching amount (etching thickness) E2 of the insulating film IL1 in the second etching step is substantially the same as the remaining film thickness T2 of the insulating film IL1 at the bottom of the opening OP1 immediately before the second etching step (E2=T2). In other words, the total of the etching amount (etching thickness) E1 of the insulating film IL1 in the first etching step and the etching amount (etching thickness) E2 of the insulating film IL1 in the second etching step is substantially the same as the film thickness T1 of the insulating film IL1 before the first etching step (that is, E1+E2=T1). The remaining film thickness T2 corresponds to a difference between the film thickness T1 of the insulating film IL1 immediately before the first etching step and the etching amount E1 of the insulating film IL1 in the first etching step, so that the formula of T2=T1−E1 is satisfied.

The second etching step takes the etching conditions (etchant and the like) under which the epitaxial layer EP is less etched than the insulating film IL1. With this arrangement, in the second etching step, the insulating film IL1 is selectively etched, and the epitaxial layer EP exposed from the opening OP1 can be suppressed or prevented from being etched (over-etched).

Figure 6:
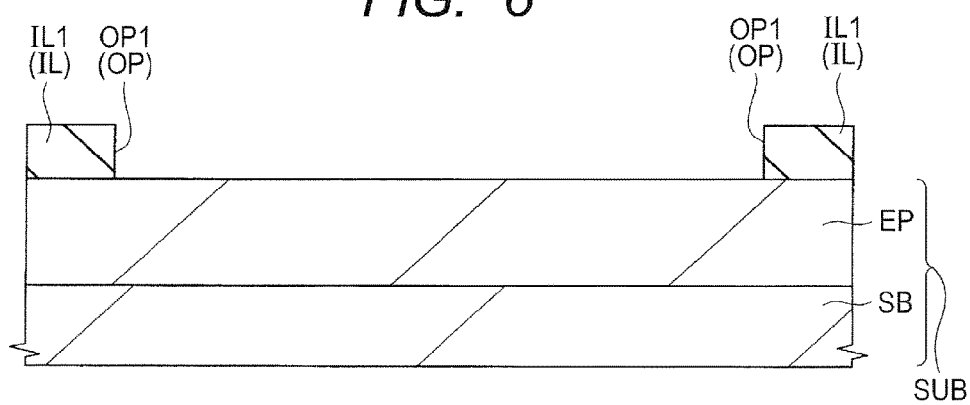
FIG. 6 is a cross-sectional view of a main part in another manufacturing step for the semiconductor device following the step shown in FIG. 5.

In this way, the first etching step and the second etching step are performed to thereby form the opening OP1 penetrating the insulating film IL1. After the second etching step, as shown in FIG. 6, the resist pattern RE1 is removed by ashing and the like.

In this way, the step of forming the opening OP1 in the insulating film IL1 is performed.

Next, p-type impurities are introduced into the epitaxial layer EP (semiconductor substrate SUB) exposed from the opening OP1 of the insulating film IL1 to thereby form the p-type semiconductor region PR. Now, the step of forming the p-type semiconductor region PR will be specifically described.

Figure 7:
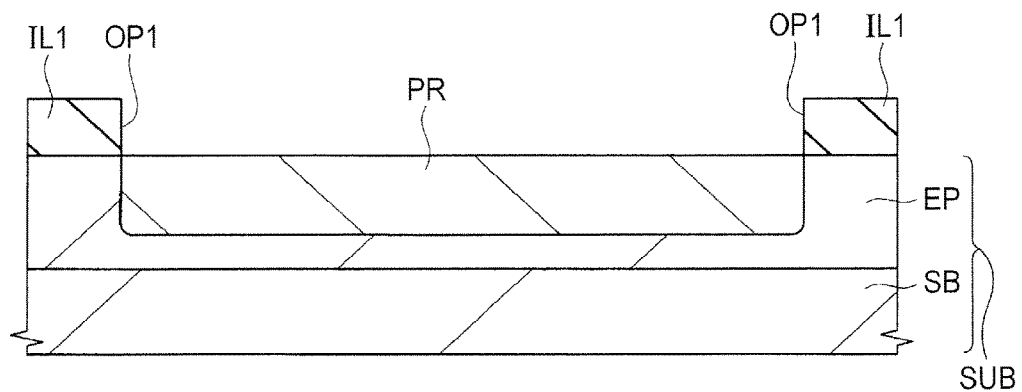
FIG. 7 is a cross-sectional view of a main part in another manufacturing step for the semiconductor device following the step shown in FIG. 6.

That is, p-type impurities (e.g., boron (B)) are ion-implanted into the epitaxial layer EP (semiconductor substrate SUB) using the insulating film IL1 as a mask (ion-implantation blocking mask). Such ion-implantation introduces (implants) the p-type impurities into the epitaxial layer EP (semiconductor substrate SUB), whereby a p-type semiconductor region PR is formed in the epitaxial layer EP as shown in FIG. 7. At this time, the p-type impurities are implanted into the part of the epitaxial layer EP exposed from the opening OP1 of the insulating film IL1, and no impurities are implanted into the remaining part of the epitaxial layer EP covered with the insulating film IL1. Thus, the p-type semiconductor region PR is formed in alignment with the opening OP1 of the insulating film IL1 in the epitaxial layer EP. To implant the ions to form the p-type semiconductor region PR, an oblique ion implantation can also be used. In this case, the p-type semiconductor region PR is formed slightly more widely than the opening OP1 in the insulating film IL1. Furthermore, after the ion implantation for formation of the p-type semiconductor region PR, the implanted p-type impurities can also be diffused by a heat treatment. The p-type semiconductor region PR is formed in the epitaxial layer EP with a predetermined depth from the surface of the epitaxial layer EP. The p-type semiconductor region PR is a p-type semiconductor region for a base (base region).

In this way, the step of forming the p-type semiconductor region PR is performed.

Figure 8:
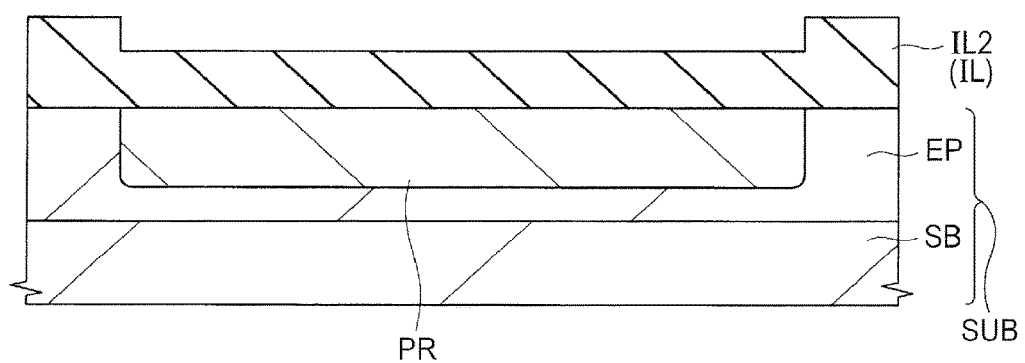
FIG. 8 is a cross-sectional view of a main part in another manufacturing step for the semiconductor device following the step shown in FIG. 7.

Then, as shown in FIG. 8, the thermal oxidation treatment is applied to the substrate to form an insulating film IL2 made of a silicon oxide film (thermal oxide film) over the epitaxial layer EP exposed at the bottom of the opening OP1, that is, over the p-type semiconductor region PR exposed at the bottom of the opening OP1. This thermal oxidation treatment increases the thickness of the insulating film IL1.

Here, since the insulating film (silicon oxide film) formed by the thermal oxidation over the epitaxial layer EP exposed at the bottom of the opening OP1 is substantially integrated with the insulating film IL1 thickened by the thermal oxidation, a combination of both insulating films will be referred to as an insulating film IL2. Thus, the entire main surface of the epitaxial layer EP is covered with the insulating film IL2, and the thickness of the part of the insulating film IL2 positioned over the p-type semiconductor region PR is thinner than the remaining part of the insulating film IL2. The insulating film IL2 is made of a silicon oxide film.

Then, a step of forming an opening OP2 in the insulating film IL2 is performed. The formation step of the opening OP2 also includes a first etching step of dry etching and a second etching step of wet etching. Regarding the first and second etching steps, the mechanism for the formation step of the opening OP2 is substantially the same as that of the opening OP1. Now, the formation step of the opening OP2 will be specifically described.

Figure 9:
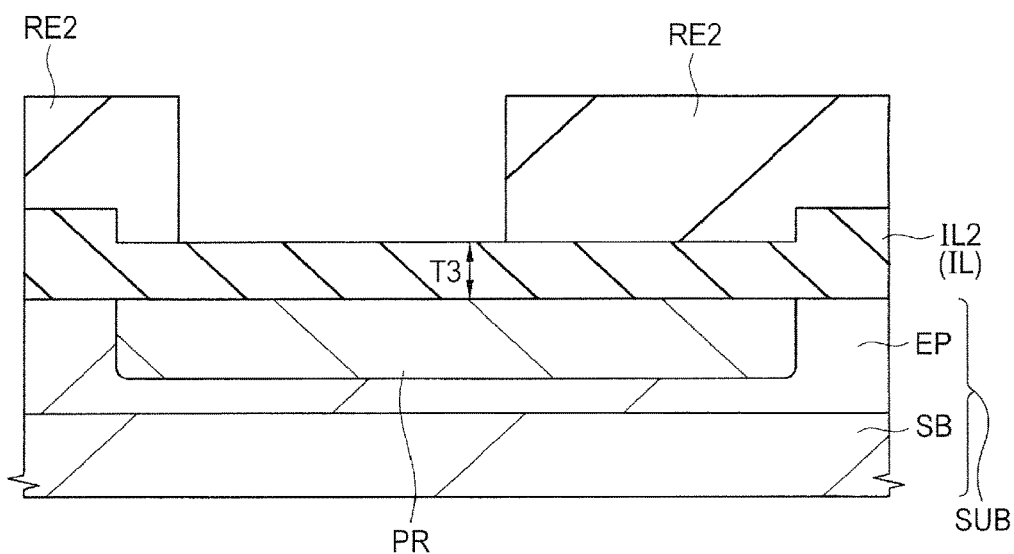
FIG. 9 is a cross-sectional view of a main part in another manufacturing step for the semiconductor device following the step shown in FIG. 8.

First, as shown in FIG. 9, a resist pattern (photoresist pattern) RE2 is formed over the insulating film IL2 as a mask layer (etching mask layer) using the photolithography technique. The resist pattern RE2 serves as the mask layer for formation of the opening OP2. The resist pattern RE2 has an opening in a region where the opening OP2 is to be formed, that is, in a region where an n-type semiconductor region NR is to be formed as described later.

Figure 10:
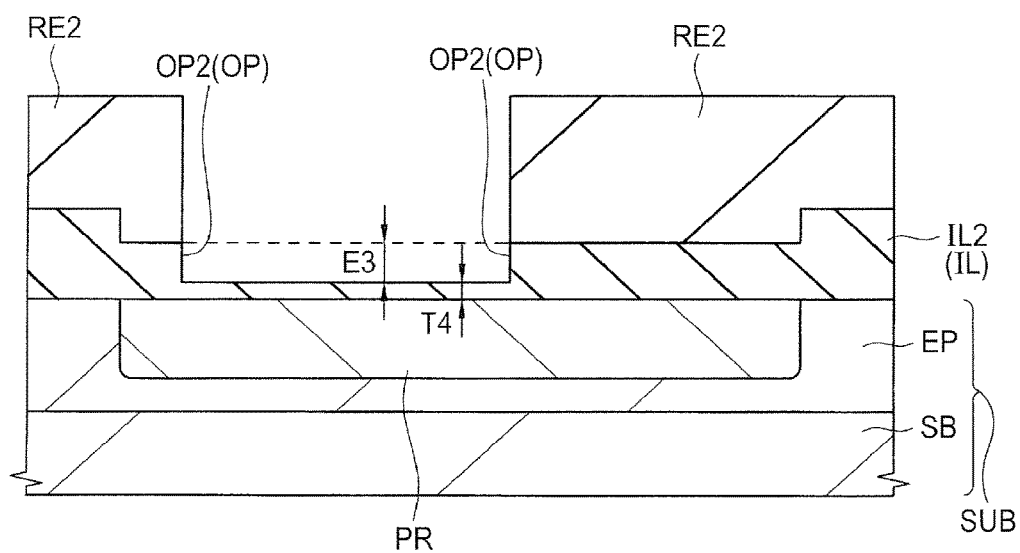
FIG. 10 is a cross-sectional view of a main part in another manufacturing step for the semiconductor device following the step shown in FIG. 9.

Then, as shown in FIG. 10, in the first etching step, the insulating film IL2 is dry etched using the resist pattern RE2 as a mask (etching mask). FIG. 10 shows the stage in which the first etching step is finished, but represents the position of a surface of the insulating film IL2 immediately before the first etching step by a dotted line for easier understanding.

In the first etching step, a part of the insulating film IL2 not covered with and exposed from the resist pattern RE2 is dry etched to thereby form the opening OP2 in the insulating film IL2. The opening OP2 is formed in alignment with the opening of the resist pattern RE2.

The first etching step is finished before the epitaxial layer EP is exposed at the bottom of the opening OP2. That is, the amount of etching (etching thickness) E3 of the insulating film IL2 in the first etching step is smaller than a film thickness (initial film thickness) T3 of the insulating film IL2 immediately before the first etching step. That is, the relationship of E3<T3 is satisfied. Thus, in the stage where the first etching step is finished, the opening OP2 does not penetrate the insulating film IL2, and the insulating film IL2 remains in the form of layer at the bottom of the opening OP2 without permitting the epitaxial layer EP to be exposed therefrom. Here, the film thickness T3 is defined as a film thickness of the insulating film IL2 in a region where the opening OP2 is to be formed, immediately before the first etching step.

Figure 11:
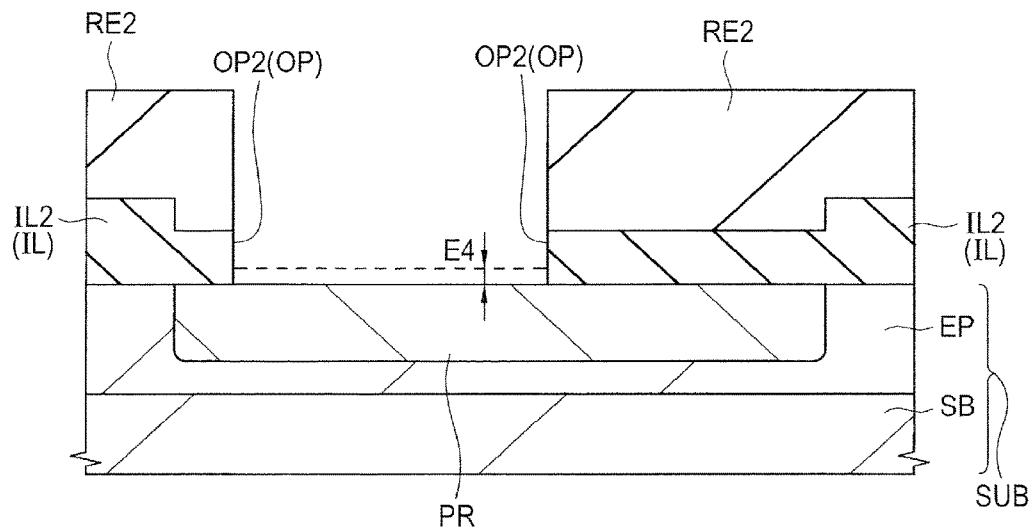
FIG. 11 is a cross-sectional view of a main part in another manufacturing step for the semiconductor device following the step shown in FIG. 10.

Then, as shown in FIG. 11, in the second etching step, the insulating film IL2 is wet etched using the resist pattern RE2 as a mask (etching mask). FIG. 11 shows the stage in which the second etching step is finished, but represents the position of a surface of the insulating film IL2 immediately before the second etching step by a dotted line for easier understanding.

In the second etching step, a part of the insulating film IL2 not covered with and exposed from the resist pattern RE2 is wet etched, whereby the insulating film IL2 exposed at the bottom surface and the side surfaces of the opening OP2 is exposed to the etchant to be etched. The second etching step is finished after the epitaxial layer EP is exposed at the bottom of the opening OP2. Thus, in the stage where the second etching step is finished, the opening OP2 passes through the insulating film IL2 with the surface of the epitaxial layer EP (more specifically, the surface of the p-type semiconductor region PR formed in the epitaxial layer EP) exposed at the bottom of the opening OP2. In the stage where the first etching step is finished, the opening OP2 does not form a through hole but makes a recessed portion, whereas in the stage where the second etching step is finished, the opening OP2 forms the through hole.

Accordingly, the etching amount (etching thickness) E4 of the insulating film IL2 in the second etching step is substantially the same as the remaining film thickness T4 of the insulating film IL2 at the bottom of the opening OP2 immediately before the second etching step (E4=T4). In other words, the total of the etching amount (etching thickness) E3 of the insulating film IL2 in the first etching step and the etching amount (etching thickness) E4 of the insulating film IL2 in the second etching step is substantially the same as the film thickness T3 of the insulating film IL2 before the first etching step (that is, E3+E4=T3). The remaining film thickness T4 corresponds to a difference between the film thickness T3 of the insulating film IL2 immediately before the first etching step and the etching amount E3 of the insulating film IL2 in the first etching step, so that the formula of T4=T3−E3 is satisfied.

The second etching step takes the etching conditions (etchant and the like) under which the epitaxial layer EP is less etched than the insulating film IL2. With this arrangement, in the second etching step, the insulating film IL2 is selectively etched, and the epitaxial layer EP exposed from the opening OP2 can be suppressed or prevented from being etched (over-etched).

Figure 12:
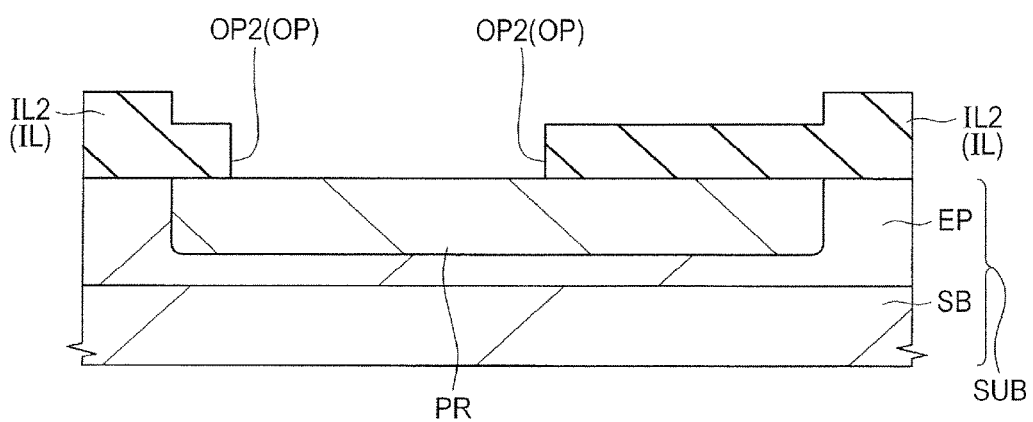
FIG. 12 is a cross-sectional view of a main part in another manufacturing step for the semiconductor device following the step shown in FIG. 11.

In this way, the first etching step and the second etching step are performed to thereby form the opening OP2 penetrating the insulating film IL2. After the second etching step, as shown in FIG. 12, the resist pattern RE2 is removed by asking and the like.

In this way, the step of forming the opening OP2 in the insulating film IL2 is performed.

Next, n-type impurities are introduced into the epitaxial layer EP (semiconductor substrate SUB) exposed from the opening OP2 of the insulating film IL2 to thereby form an n-type semiconductor region NR. Now, the step of forming the n-type semiconductor region NR will be specifically described.

Figure 13:
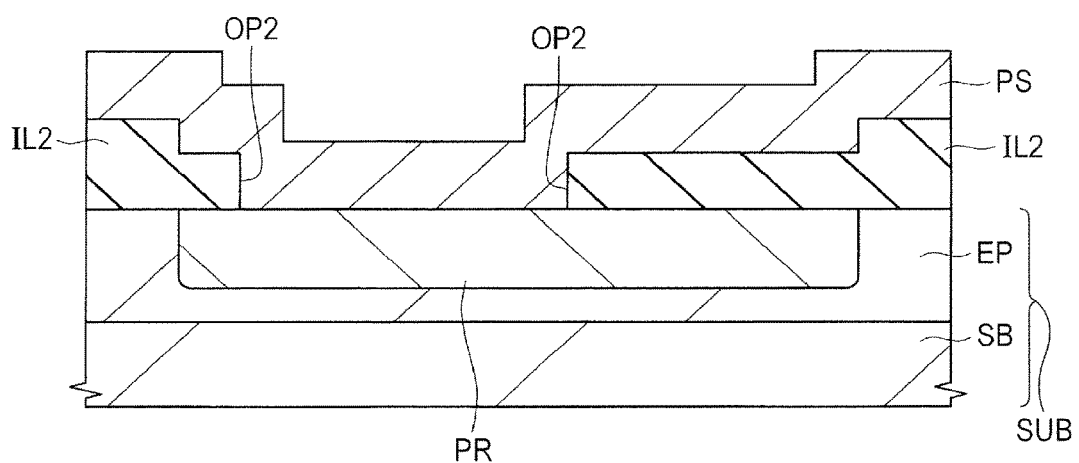
FIG. 13 is a cross-sectional view of a main part in another manufacturing step for the semiconductor device following the step shown in FIG. 12.

First, as shown in FIG. 13, an n-type impurity-containing film PS is formed over the entire main surface of the semiconductor substrate SUB, that is, over the insulating film IL2 including the opening OP2. The n-type impurity-containing film PS is a film containing n-type impurities (at a high concentration), such as phosphorus (P). The n-type impurity-containing film PS suitable for use can be, for example, a polysilicon film (doped polysilicon film) doped with n-type impurities, such as phosphorus (P). After the n-type impurity-containing film PS is formed, the n-type impurity-containing film PS is in contact with the surface of the epitaxial layer EP (p-type semiconductor region PR) exposed at the bottom of the opening OP2 of the insulating film IL2.

Figure 14:
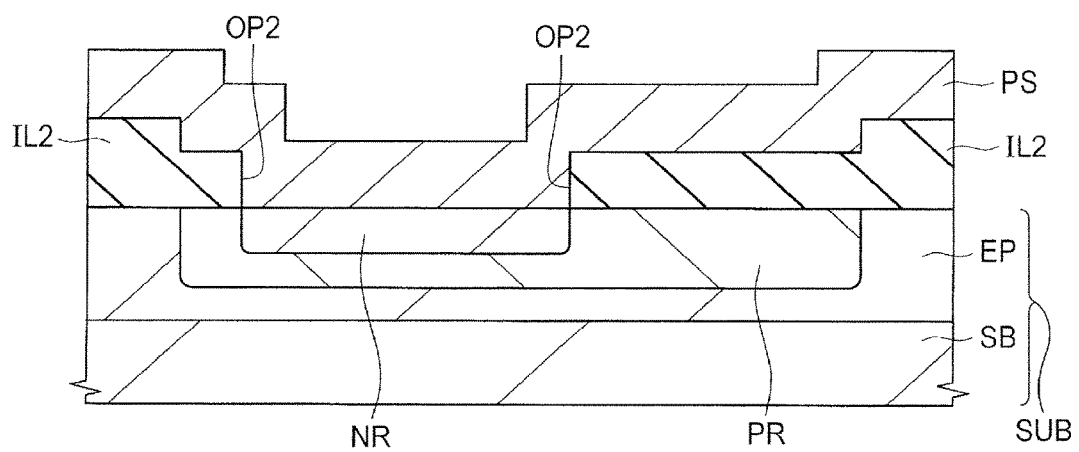
FIG. 14 is a cross-sectional view of a main part in another manufacturing step for the semiconductor device following the step shown in FIG. 13.

Then, n-type impurities are diffused by a thermal diffusion process from the n-type impurity-containing film PS into the part of the epitaxial layer EP (p-type semiconductor region PR) exposed from the opening OP2 of the insulating film IL2. Thus, as shown in FIG. 14, the n-type impurities are introduced into the epitaxial layer EP, more specifically, into the p-type semiconductor region PR to thereby form the n-type semiconductor region NR. The n-type semiconductor region NR is formed to be included in the p-type semiconductor region PR. Thus, the bottom surface (lower surface) and side surfaces of the n-type semiconductor region NR are in contact with the p-type semiconductor region PR. The n-type semiconductor region NR is an n-type semiconductor region for an emitter (emitter region). The n-type semiconductor region NR is formed in a predetermined depth from the surface of the epitaxial layer EP to be included in the p-type semiconductor region PR. The depth of the n-type semiconductor region NR (the depth position of the bottom surface thereof) is shallower than that of the p-type semiconductor region PR (the depth position of the bottom surface thereof).

Figure 15:
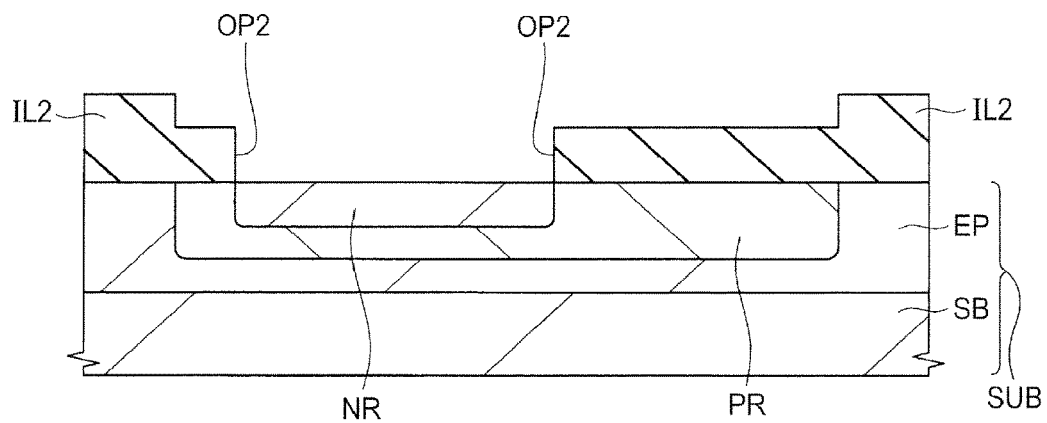
FIG. 15 is a cross-sectional view of a main part in another manufacturing step for the semiconductor device following the step shown in FIG. 14.

Then, as shown in FIG. 15, the n-type impurity-containing film PS is removed by wet etching and the like.

In this way, the step of forming the n-type semiconductor region NR is performed.

Figure 16:
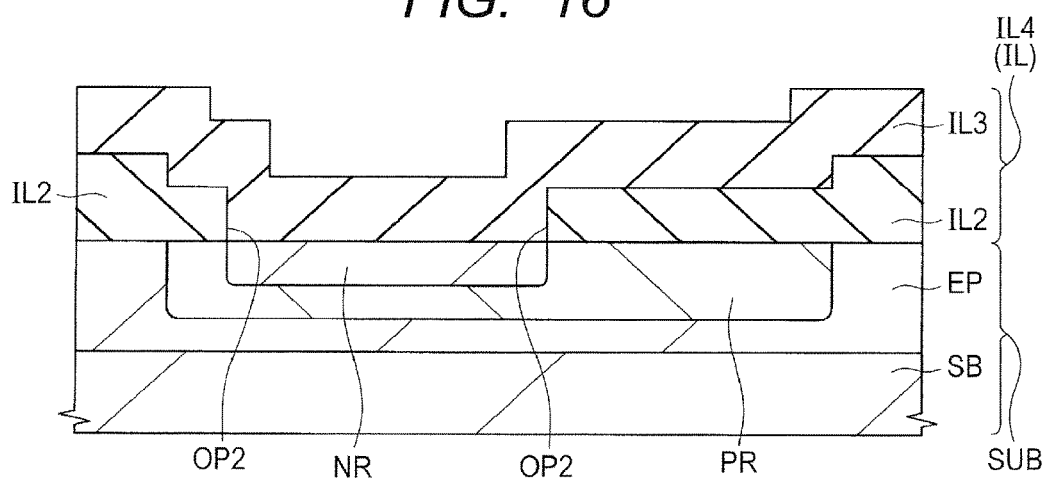
FIG. 16 is a cross-sectional view of a main part in another manufacturing step for the semiconductor device following the step shown in FIG. 15.

Then, as shown in FIG. 16, an insulating film IL3 is formed over the entire main surface of the semiconductor substrate SUB, that is, over the insulating film IL2 including the inside of the opening OP2. The insulating film IL3 can be formed, for example, of a silicon oxide film by a chemical vapor deposition (CVD) method and the like.

Here, a combination of the insulating film IL2 and the insulating film IL3 is referred to as an insulating film IL4. Within the opening OP2 of the insulating film IL2, the insulating film IL4 is configured of a single film of the insulating film IL3, whereas in the remaining region other than the opening OP2 of the insulating film IL2, the insulating film IL4 is configured of a laminated film that includes the insulating film IL2 and the insulating film IL3 over the insulating film IL2. Thus, the part of the insulating film IL4 configured of the single film of the insulating film IL3 is thinner than the remaining part of the insulating film IL4 configured of the laminated film of the insulating film IL2 and the insulating film IL3.

Then, a step of forming a contact hole (opening) CT is performed. The formation step of the contact hole CT also includes a first etching step of dry etching and a second etching step of wet etching. Regarding the first and second etching steps, the mechanisms for the formation steps of the contact holes CT are substantially the same as those for the formation steps of the above-mentioned openings OP1 and OP2. Now, the formation step of the contact hole CT will be specifically described. Note that the contact hole CT can be regarded as an opening.

Figure 17:
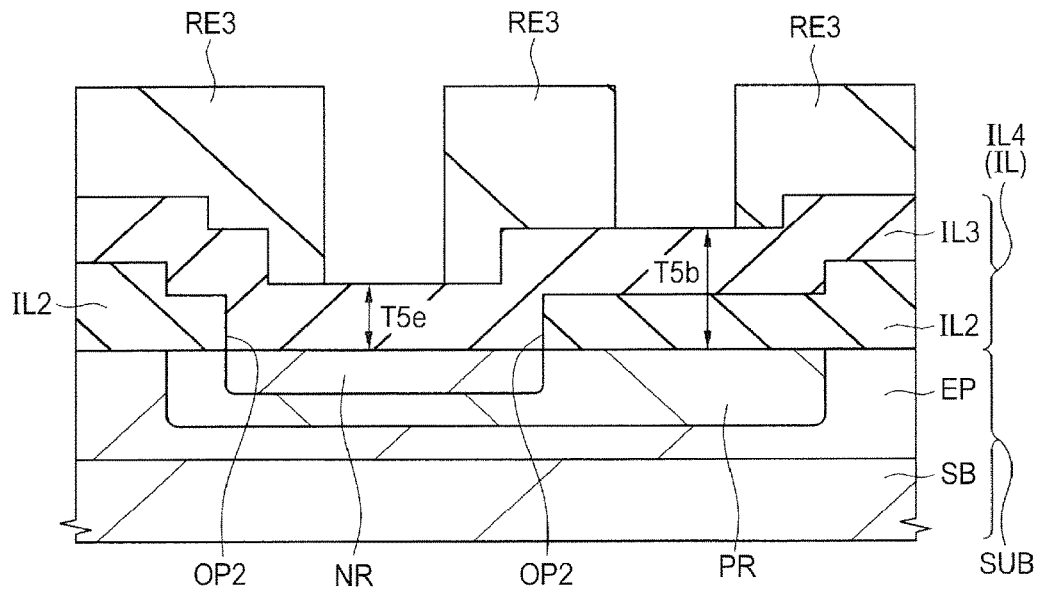
FIG. 17 is a cross-sectional view of a main part in another manufacturing step for the semiconductor device following the step shown in FIG. 16.

First, as shown in FIG. 17, a resist pattern (photoresist pattern) RE3 is formed over the insulating film IL4, specifically, over the insulating film IL3, as a mask layer (etching mask layer) using the photolithography technique. The resist pattern RE3 is a mask layer for formation of contact holes CT and has openings where contact holes CT are to be formed.

Here, a plurality of contact holes CT are formed and include a contact hole CT formed over the n-type semiconductor region NR to expose the n-type semiconductor region NR therefrom, as well as a contact hole CT formed over the p-type semiconductor region PR to expose the p-type semiconductor region PR therefrom. Thus, the contact hole CT formed over the n-type semiconductor region NR to expose the n-type semiconductor region NR therefrom is denoted by reference character CTE, and hereinafter referred to as an emitter contact hole (emitter opening) CTE. Furthermore, the contact hole CT formed over the p-type semiconductor region PR to expose the p-type semiconductor region PR therefrom is denoted by a reference character CTB, and hereinafter referred to as a base contact hole (base opening) CTB. In this way, the resist pattern RE3 has respective openings in a region where the emitter contact hole CTE is to be formed as well as a region where the base contact hole CTB is to be formed.

In plan view, the emitter contact hole CTE is formed to be positioned within the n-type semiconductor region NR, and thus the emitter contact hole CTE is formed to be positioned within the opening OP2 in plan view. Because of this, the emitter contact hole CTE is formed in the part of the insulating film IL4 configured of the single film of the insulating film IL3. That is, the emitter contact hole CTE is formed in the insulating film IL3. The base contact hole CTB is formed not to overlap with the n-type semiconductor region NR, but to overlap with the p-type semiconductor region PR in plan view. Thus, the base contact hole CTB is formed in the part of the insulating film IL4 configured of the laminated film of the insulating film IL2 and the insulating film IL3. That is, the base contact hole CTB is formed in the laminated film of the insulating film IL2 and the insulating film IL3.

Figure 18:
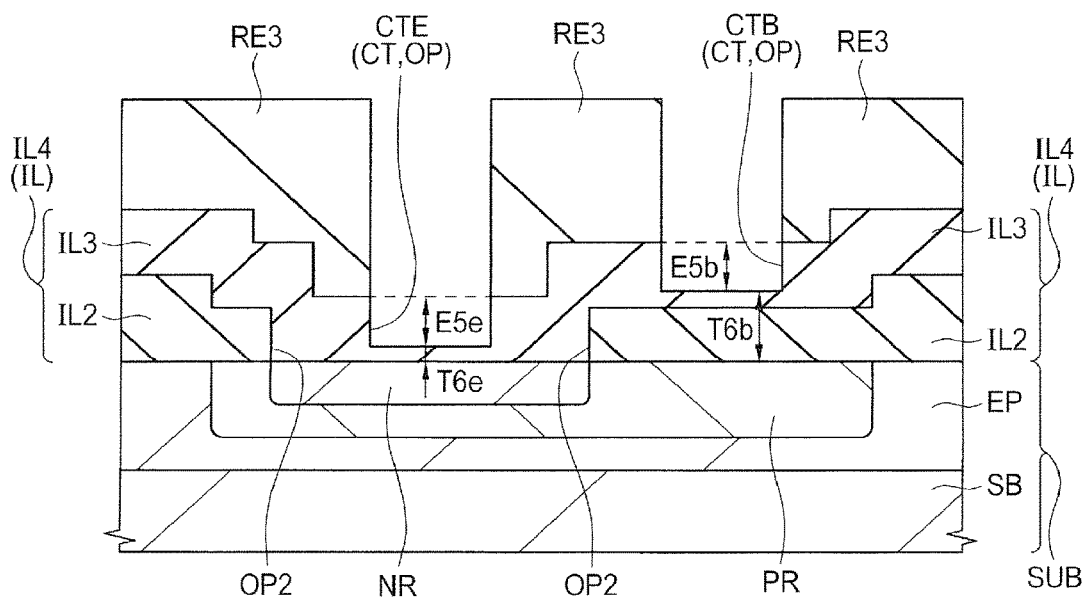
FIG. 18 is a cross-sectional view of a main part in another manufacturing step for the semiconductor device following the step shown in FIG. 17.

Then, as shown in FIG. 18, in the first etching step, the insulating film IL4 is dry etched using the resist pattern RE3 as a mask (etching mask). FIG. 18 shows the stage in which the first etching step is finished, but represents the position of a surface of the insulating film IL3 immediately before the first etching step by a dotted line for easier understanding.

In the first etching step, the part of the insulating film IL4 not covered with and exposed from the resist pattern RE3 is dry etched, thereby forming the contact holes CT in the insulating film IL4. The contact holes CT are formed in alignment with the openings of the resist pattern RE3.

The first etching step is finished before the epitaxial layer EP is exposed at the bottom of the contact hole CT. Thus, in the stage where the first etching step is finished, the contact holes CT do not pass through the insulating film IL4, and the insulating film IL4 remains in the form of layer at the bottoms of the contact holes CT without permitting the epitaxial layer EP to be exposed therefrom. That is, in the stage where the first etching step is finished, the epitaxial layer EP is neither exposed at the bottom of the emitter contact hole CTE nor the bottom of the base contact hole CTB.

Here, a film thickness (initial film thickness) $T5e$ of the insulating film IL4 in the region where the emitter contact hole CTE is to be formed immediately before the first etching step is smaller than a film thickness (initial film thickness) $T5b$ of the insulating film IL4 in the region where the base contact hole CTB is to be formed immediately before the first etching step ($T5e<T5b$). Thus, in the region where the emitter contact hole CTE is to be formed, the amount of etching (etching thickness) $E5e$ of the insulating film IL4 in the first etching step is smaller than the above-mentioned film thickness $T5e$, whereas in the region where the base contact hole CTB is to be formed, the amount of etching (etching thickness) $E5b$ of the insulating film IL4 in the first etching step is smaller than the above-mentioned film thickness $T5b$. That is, the relationships of $E5e<T5e$ and $E5b<T5b$ are satisfied. The etching amount $E5e$ is substantially the same as the etching amount $E5b$ ($E5e=E5b$).

Figure 19:
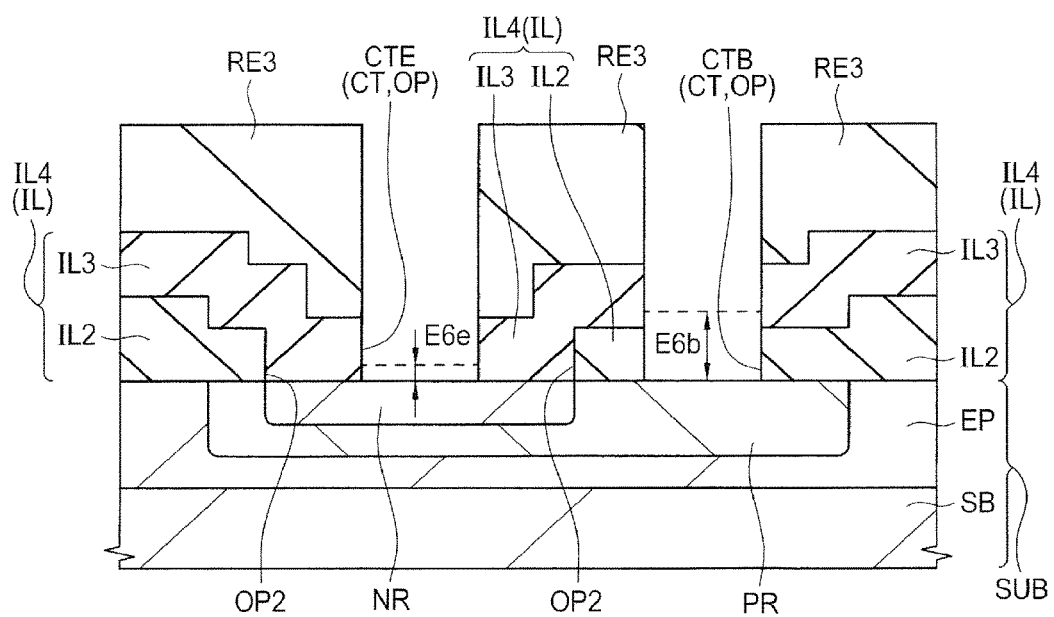
FIG. 19 is a cross-sectional view of a main part in another manufacturing step for the semiconductor device following the step shown in FIG. 18.

Then, as shown in FIG. 19, in the second etching step, the insulating film IL4 is wet etched using the resist pattern RE3 as a mask (etching mask). FIG. 19 shows the stage in which the second etching step is finished, but represents the position of a surface of the insulating film IL3 immediately before the second etching step by a dotted line for easier understanding.

In the second etching step, a part of the insulating film IL4 not covered with and exposed from the resist pattern RE3 is wet etched, whereby the insulating film IL4 exposed at the bottom surface and side surfaces of each contact hole CT is exposed to the etchant to be etched. The second etching step is finished after the epitaxial layer EP is exposed at the bottoms of the contact holes CT.

Thus, in the stage where the second etching step is finished, the contact holes CT pass through the insulating film IL4 with the surface of the epitaxial layer EP exposed at the bottom of the opening OP2. That is, in the stage where the second etching step is finished, the emitter contact hole CTE passes through the insulating film IL3 formed over the n-type semiconductor region NR with the surface of the n-type semiconductor region NR exposed at the bottom of the emitter contact hole CTE. In the stage where the second etching step is finished, the base contact hole CTB passes through the lamination film of the insulating films IL2 and IL3 formed over the p-type semiconductor region PR with the surface of the p-type semiconductor region PR exposed at the bottom of the base contact hole CTB. Thus, in the stage where the first etching step is finished, the contact holes CT (CTB, CTE) do not form the through holes and make recessed portions, whereas in the stage where the second etching step is finished, the contact holes CT (CTB, CTE) form the through holes.

In the region where the emitter contact hole CTE is to be formed, the etching amount (etching thickness) E6e of the insulating film IL4 in the second etching step is substantially the same as the remaining film thickness T6e of the insulating film IL4 at the bottom of the emitter contact hole CTE immediately before the second etching step (E6e=T6e). In the region where the base contact hole CTB is to be formed, the etching amount (etching thickness) E6b of the insulating film IL4 in the second etching step is substantially the same as the remaining film thickness T6b of the insulating film IL4 at the bottom of the base contact hole CTB immediately before the second etching step (E6b=T6b). In other words, in the region where the emitter contact hole CTE is to be formed, the total of the etching amount (etching thickness) E5e of the insulating film IL4 in the first etching step and the etching amount (etching thickness) E6e of the insulating film IL4 in the second etching step is substantially the same as the film thickness T5e of the insulating film IL4 before the first etching step (that is, E5e+E6e=T5e). In the region where the base contact hole CTB is to be formed, the total of the etching amount (etching thickness) E5b of the insulating film IL4 in the first etching step and the etching amount (etching thickness) E6b of the insulating film IL4 in the second etching step is substantially the same as the film thickness T5b of the insulating film IL4 before the first etching step (that is, E5b+E6b=T5b).

The second etching step takes the etching conditions (etchant and the like) under which the epitaxial layer EP is less etched than the insulating film IL4. With this arrangement, in the second etching step, the insulating film IL4 is selectively etched, and the epitaxial layer EP exposed from the contact holes CT can be suppressed or prevented from being etched (over-etched).

Figure 20:
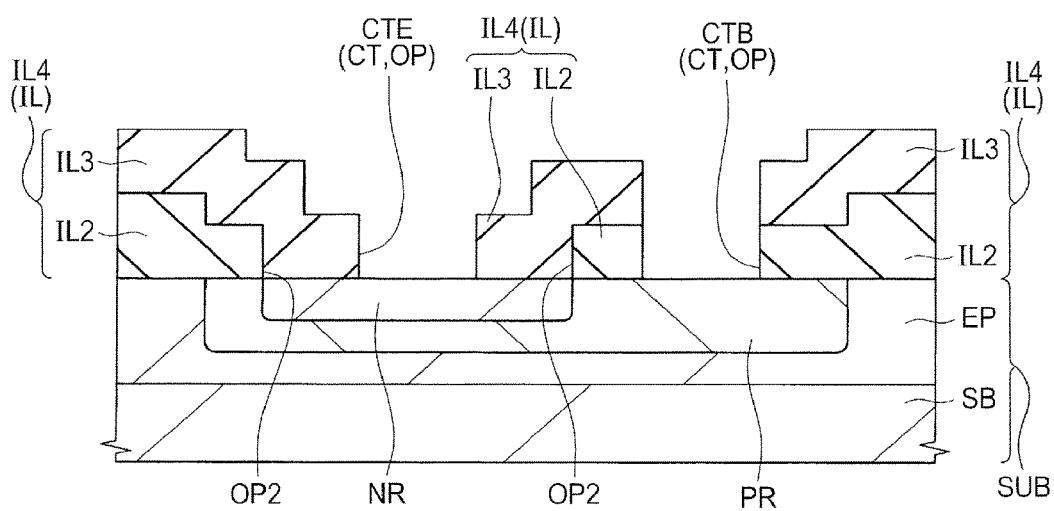
FIG. 20 is a cross-sectional view of a main part in another manufacturing step for the semiconductor device following the step shown in FIG. 19.

Thus, the first etching step and the second etching step are performed to form the contact holes CT (the emitter contact hole CTE and the base contact hole CTB) passing through the insulating film IL4. After the second etching step, as shown in FIG. 20, the resist pattern RE3 is removed by ashing and the like.

In this way, the step of forming the contact holes CT is performed.

Figure 21:
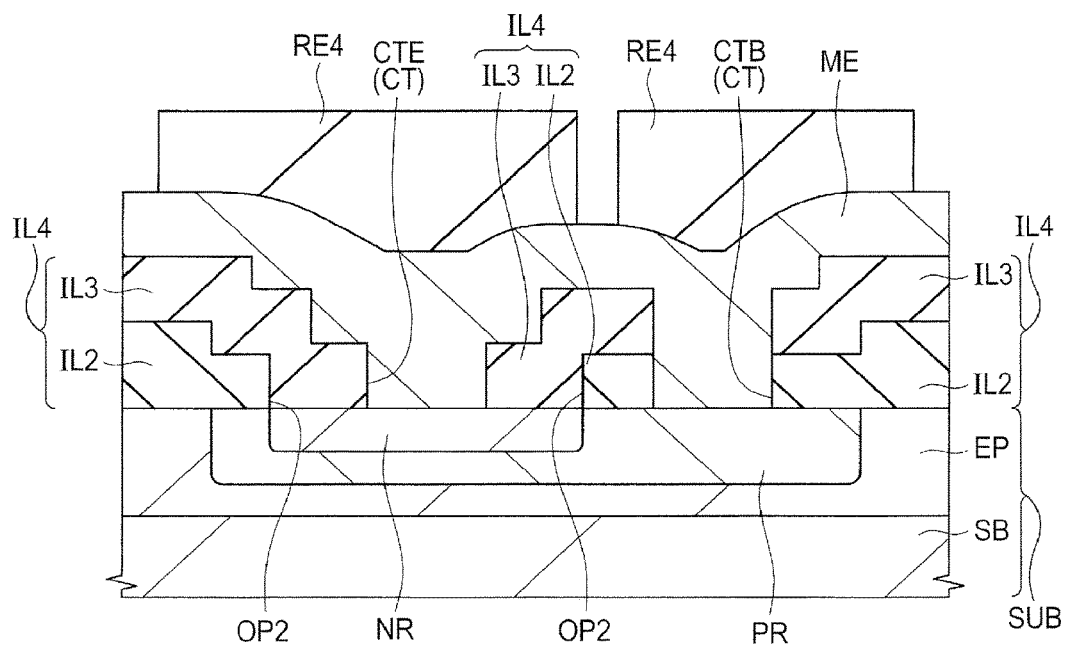
FIG. 21 is a cross-sectional view of a main part in another manufacturing step for the semiconductor device following the step shown in FIG. 20.

Then, as shown in FIG. 21, a metal film ME is formed as a conductive film for formation of a wiring over the insulating film IL4 including the insides of the contact holes CT. The metal film ME is made, for example, of an aluminum (Al) film or an aluminum (Al) alloy film. In the use of the aluminum alloy film, an alloy film containing aluminum (Al) as a principal component with silicon (Si) and the like added thereto can be employed. The metal film ME suitable for use can include a laminated film of a plurality of metal films. The metal film ME is formed over the insulating film IL4 to fill the contact holes CT therewith.

Then, a resist pattern (photoresist pattern) RE4 is formed over the metal film ME by the photolithography technique.

Figure 22:
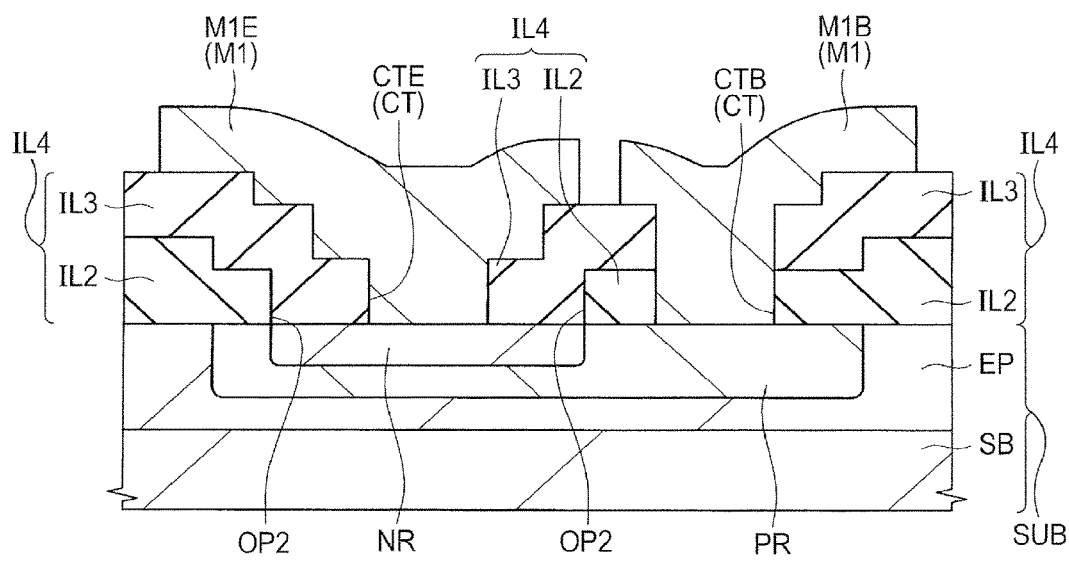
FIG. 22 is a cross-sectional view of a main part in another manufacturing step for the semiconductor device following the step shown in FIG. 21.

Subsequently, the metal film ME is etched (preferably dry etched) using the resist pattern RE4 as a mask (etching mask) to thereby pattern the metal film ME. The patterned metal film ME forms wirings M1. The wirings M1 include an emitter wiring M1E and a base wiring M1B. Thereafter, the resist pattern RE4 is removed by ashing and the like. FIG. 22 shows this stage.

The emitter wiring M1E includes the emitter contact hole CTE in plan view. The base wiring M1B includes the base contact hole CTB in plan view. Thus, the emitter wiring M1E is formed over the insulating film IL4 and is integrated with apart filling the emitter contact hole CTE (via). Further, the base wiring M1B is formed over the insulating film IL4 and is integrated with apart filling the base contact hole CTB (via). Here, the part of the emitter wiring M1E that fills the emitter contact hole CTE is referred to as the via of the emitter wiring M1E, while the part of the base wiring M1B that fills the base contact hole CTB is referred to as the via of the base wiring M1B. The via of the emitter wiring M1E is electrically coupled to the n-type semiconductor region NR at the bottom of the emitter contact hole CTE. The via of the base wiring M1B is electrically coupled to the p-type semiconductor region PR at the bottom of the base contact hole CTB. Thus, the emitter wiring M1E is electrically coupled to the n-type semiconductor region NR, and the base wiring M1B is electrically coupled to the p-type semiconductor region PR.

Although in this embodiment, the wirings M1 and the vias (parts filling the contact holes CT) are integrally formed together, the wirings M1 and the vias (parts filling the contact holes CT) can be separately formed in different steps in other embodiments. In that case, for example, the following step should be performed.

That is, after forming the contact holes CT in the way described above, a conductive film (metal film) is formed over the insulating film IL4 to fill the contact holes CT, and then the conductive film positioned outside each contact hole CT is removed by a chemical mechanical polishing (CMP) method, an etch-back method, etc., to leave the conductive film in the contact holes CT. In this way, the via (conductive plug) is formed of the conductive film (metal film) embedded in each contact hole CT. Then, the metal film is formed over the insulating film IL4 with the vias embedded therein, and is patterned by the photolithography and etching, thereby forming the wiring. In this case, the via embedded in each contact hole CT has its upper surface in contact with the wiring, thereby establishing the electric coupling with the wiring. Here, the combination of the wiring and the via coupled thereto corresponds to the above-mentioned wiring M1.

In either case, the conductive film is embedded in the contact holes CT, and this conductive film is electrically coupled to the epitaxial layer EP exposed from the contact holes CT (more specifically, the n-type semiconductor region NR or p-type semiconductor region PR). For this reason, after the formation step of the contact holes CT, a step of embedding the conductive film (more specifically, the metal film) in the contact holes CT is performed. Here, the metal film means the conductive film exhibiting metallic conduction, and can include not only a pure metal film and an alloy film, but also a metal compound film exhibiting the metallic conduction.

Figure 23:
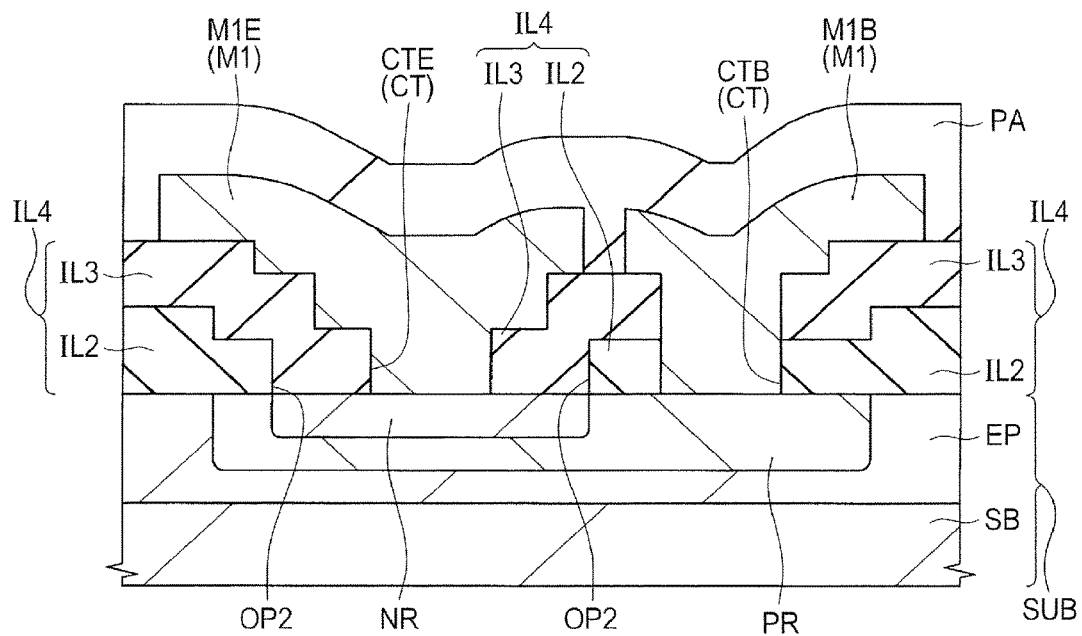
FIG. 23 is a cross-sectional view of a main part in another manufacturing step for the semiconductor device following the step shown in FIG. 22.

Then, as shown in FIG. 23, an insulating film (protective film) PA is formed as a passivation film over the insulating film IL4 to cover the wirings M1 (emitter wiring M1E and base wiring M1B). The insulating film PA is configured of, for example, an organic insulating film that contains polyimide as a principal component.

Next, a resist pattern (not shown) is formed over the insulating film PA by the photolithography technique, and the insulating film PA is then etched (e.g., dry etched) by using the resist pattern as the etching mask, thereby forming an emitter opening and a base opening in the insulating film PA. Note that the cross-sectional view of FIG. 23 neither shows the emitter opening nor the base opening in the insulating film PA. However, FIG. 29 to be described later shows the emitter opening OPE and the base opening OPB in the insulating film PA. The emitter opening and the base opening pass through the insulating film PA. The emitter wiring M1E exposed from the emitter opening forms an emitter bonding pad, while the base wiring M1B exposed from the base opening forms a base bonding pad. FIG. 29, which is to be described later, shows the emitter bonding pad PDE and the base bonding pad PDB. Thereafter, the unnecessary resist pattern is removed by asking and the like.

Then, the backside of the semiconductor substrate SUB (that is, the backside of the substrate main body SB) is polished or the like as appropriate to thin the semiconductor substrate SUB. Here, the backside of the semiconductor substrate SUB corresponds to the main surface opposite to the side where the epitaxial layer EP is formed.

Figure 24:
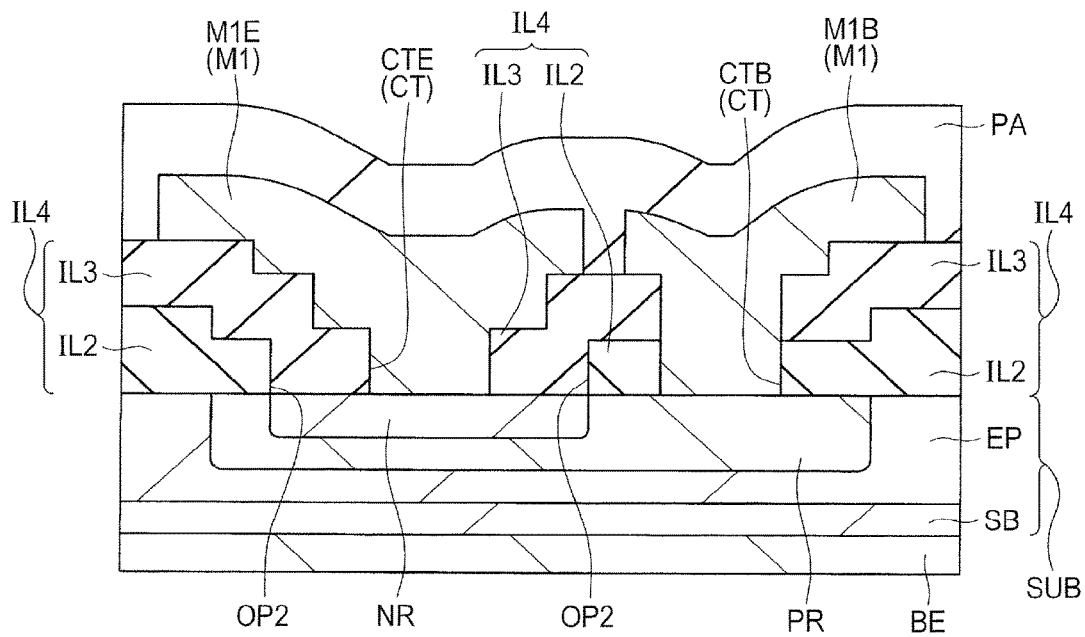
FIG. 24 is a cross-sectional view of a main part in another manufacturing step for the semiconductor device following the step shown in FIG. 23.

Then, as shown in FIG. 24, a backside electrode (collector electrode) BE is formed at the backside of the semiconductor substrate SUB (backside of the substrate main body SB). The backside electrode BE is formed at the entire backside of the semiconductor substrate SUB and can be formed, for example, by a sputtering method, a vapor deposition method, and the like. The backside electrode BE is made of the metal film and the like. A laminated film of a plurality of metal films can be used as the backside electrode.

Thereafter, the semiconductor substrate SUB is divided (cut) into individual chip regions by dicing and the like, thereby producing semiconductor chips (semiconductor devices). In this way, the semiconductor device is manufactured. The thus-obtained semiconductor chip is packaged as needed.

A bipolar transistor is formed at the semiconductor substrate SUB included in the semiconductor device. The n-type semiconductor region NR functions as an emitter region of the bipolar transistor, while the p-type semiconductor region PR functions as a base region of the bipolar transistor. A part of the semiconductor substrate SUB that keeps the n-type conduction functions as a collector region of the bipolar transistor. For example, the part of the n-type semiconductor substrate SUB positioned between the p-type semiconductor region PR and the backside electrode BE functions as the collector region. A PN junction surface formed between the emitter region and the base region corresponds to a PN junction surface formed between the n-type semiconductor region NR and the p-type semiconductor region PR (that is, the bottom surface and side surfaces of the n-type semiconductor region NR). Further, a PN junction surface formed between the base region and the collector region corresponds to a PN junction surface formed between the p-type semiconductor region PR and a part of the semiconductor substrate SUB that keeps the n-type conduction (that is, the bottom surface and side surfaces of the p-type semiconductor region PR).

Thus, in the semiconductor substrate SUB, the base region (p-type semiconductor region PR) is formed to be contained in the collector region (the part of the semiconductor substrate SUB that keeps the n-type conduction), and the emitter region (n-type semiconductor region NR) is formed to be contained in the base region. In other words, in the semiconductor substrate SUB, the base region (p-type semiconductor region PR) is formed to enclose the emitter region (n-type semiconductor region NR), the collector region (the part of the semiconductor substrate SUB that keeps the n-type conduction) is formed to enclose the base region, and the collector electrode (backside electrode BE) is formed to be in contact with the collector region.

The backside electrode BE functions as a collector electrode, the emitter wiring M1E functions as an emitter electrode, and the base wiring M1B functions as a base electrode. An emitter voltage is supplied from the emitter wiring M1E to the n-type semiconductor region NR, a base voltage is supplied from the base wiring M1B to the p-type semiconductor region PR, and a collector voltage is supplied from the backside electrode BE to the semiconductor substrate SUB (the part of the n-type semiconductor substrate SUB adjacent to the backside electrode BE).

Although in this embodiment, the case of manufacturing the semiconductor device with an NPN type bipolar transistor has been described above, the conduction type may be reversed, whereby a semiconductor device can be manufactured to have a PNP type bipolar transistor.

<Overall Structure of Semiconductor Device>

FIGS. 25 to 29 show plan views (entire plan views) of one example of a semiconductor device (semiconductor chip) CP in this embodiment, and illustrate a chip layout by way of example.

Figure 25:
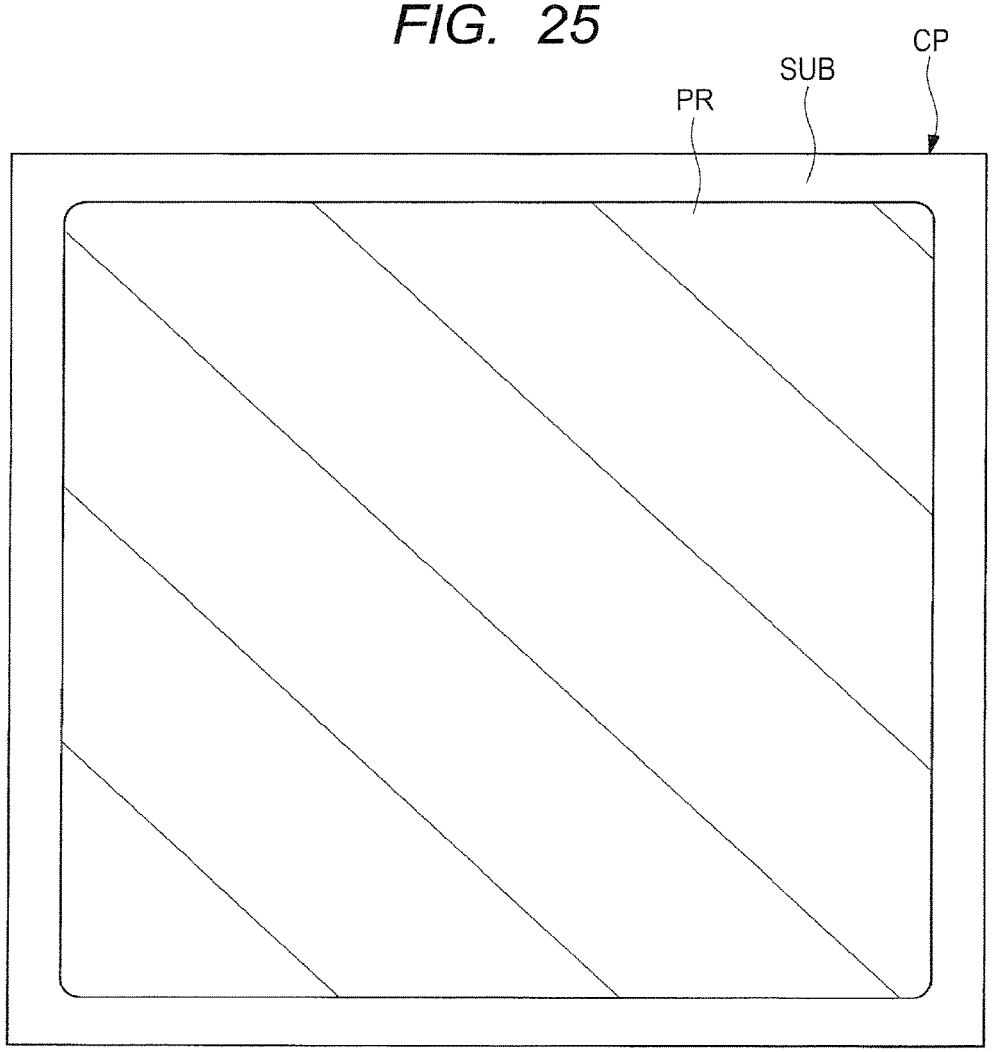
FIG. 25 is a plan view showing one example of the semiconductor device according to the one embodiment.

FIG. 25 shows a formation region of the p-type semiconductor region PR, specifically, giving hatching to a planar region where the p-type semiconductor region PR is formed for easier understanding.

For the case shown in FIG. 25, in plan view, the p-type semiconductor region PR is formed over the substantially whole semiconductor substrate SUB included in the semiconductor device CP, except for the vicinity of its outer peripheral part.

Figure 26:
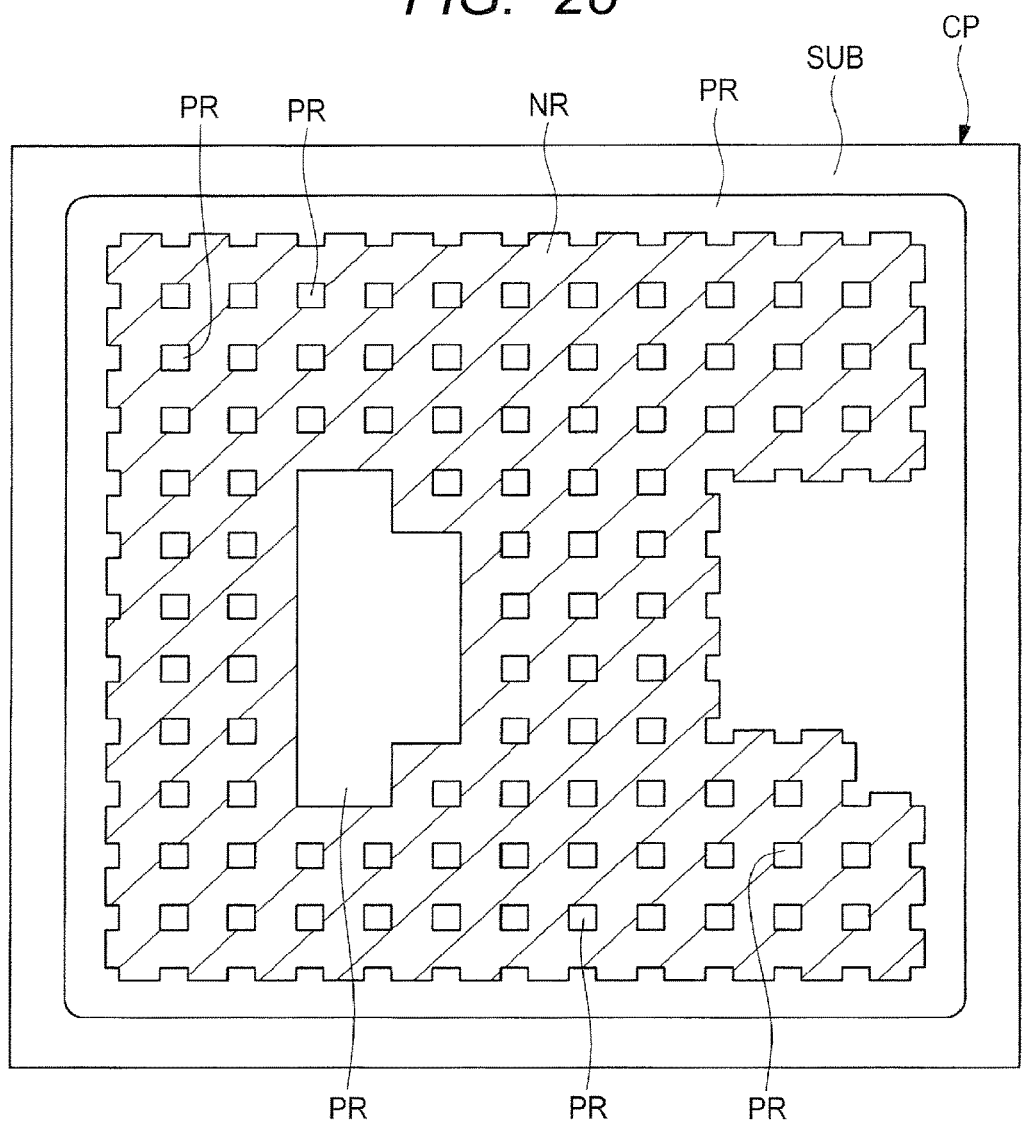
FIG. 26 is another plan view showing the one example of the semiconductor device in the one embodiment.

FIG. 26 shows a diagram obtained by adding a formation region of the n-type semiconductor region NR to FIG. 25, specifically giving hatching to a planar region where the formation region for the n-type semiconductor region NR is formed without making the p-type semiconductor region PR hatched, for easier understanding.

In plan view, the n-type semiconductor region NR is formed to be contained in the p-type semiconductor region PR. For the case shown in FIG. 26, in plan view, there is provided a plurality of regions included in the n-type semiconductor region NR so as not to have the n-type semiconductor region NR formed therein and to expose the p-type semiconductor region PR therefrom at the surface of the semiconductor substrate SUB. In these regions, the base contact holes CTB are disposed (see FIGS. 26 and 27). Thus, the number of the base contact holes CTB formed over the p-type semiconductor region PR can be increased.

Figure 27:
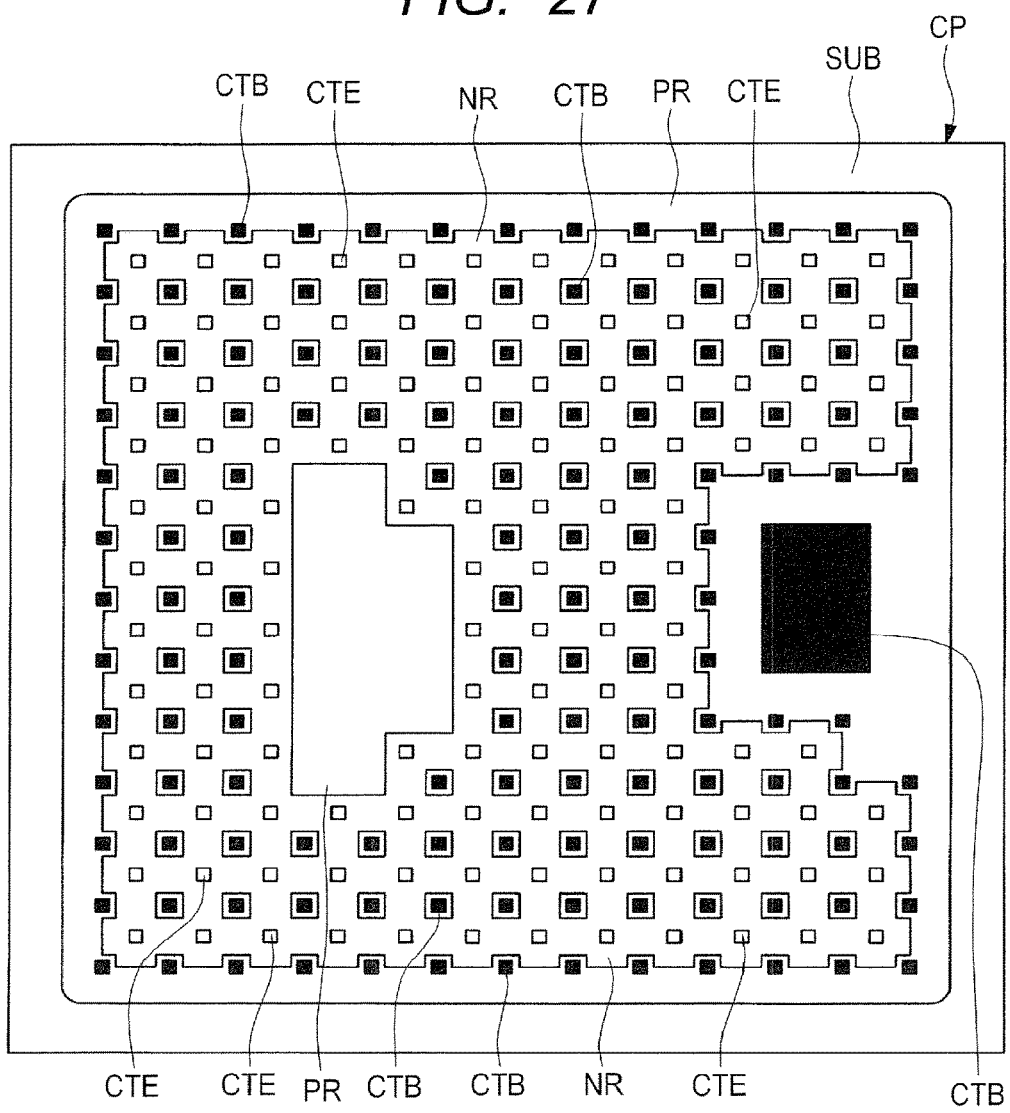
FIG. 27 is another plan view showing the one example of the semiconductor device in the one embodiment.

FIG. 27 is a diagram obtained by adding formation positions of the emitter contact holes CTE and the base contact holes CTB to FIG. 26, in which hatching is not given to the p-type semiconductor region PR and the n-type semiconductor region NR. To easily distinguish between the emitter contact holes CTE and the base contact holes CTB, the base contact holes CTB are indicated using black squares.

In plan view, the emitter contact holes CTE are disposed in positions where these emitter contact holes overlap with the n-type semiconductor region NR, while the base contact holes CTB are disposed in positions where these base contact holes overlap with the p-type semiconductor region PR.

Figure 28:
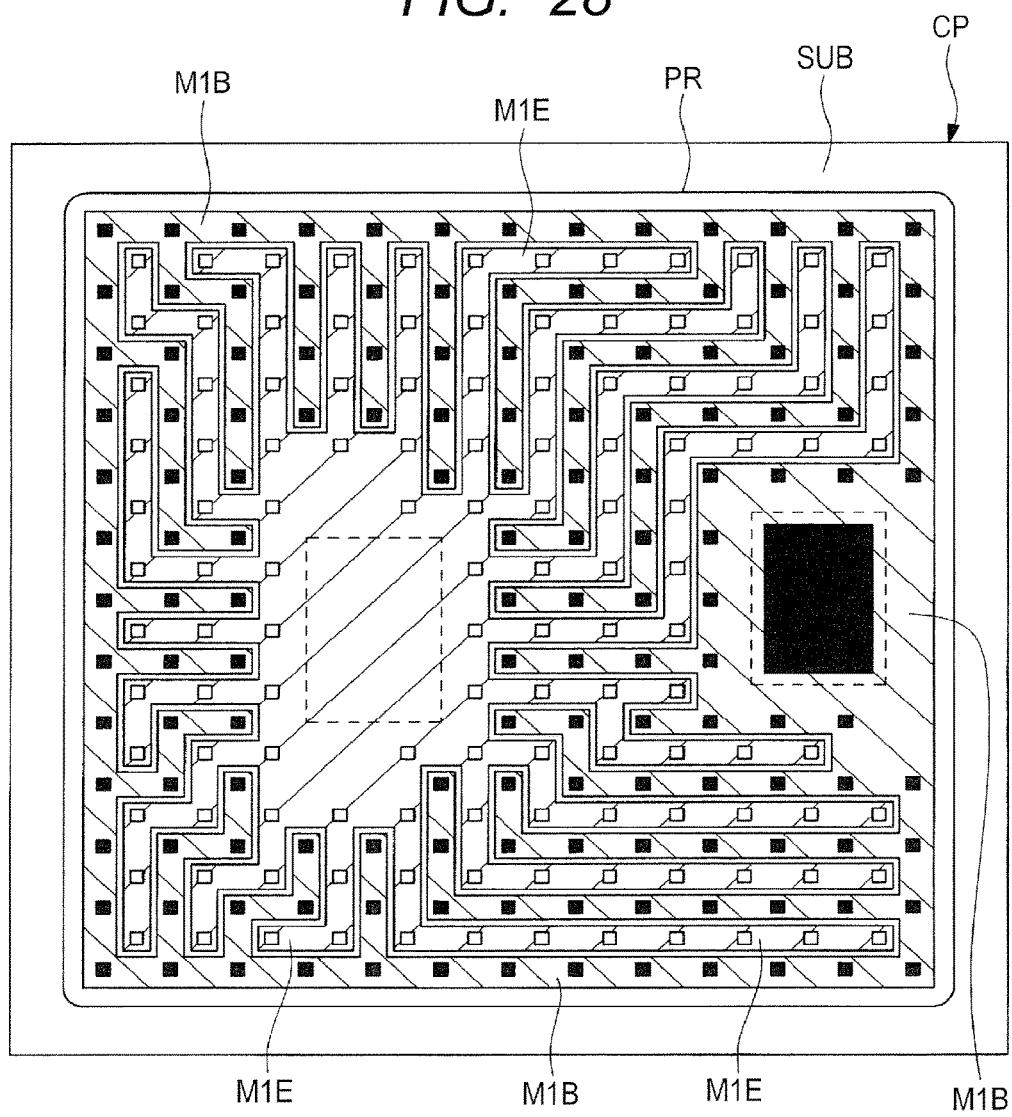
FIG. 28 is another plan view showing the one example of the semiconductor device in the one embodiment.

FIG. 28 illustrates the emitter wirings M1E and the base wirings M1B by hatching together with the emitter contact holes CTE and the base contact holes CTB, as well as the outer peripheral position of the p-type semiconductor region PR.

As can be seen from FIGS. 27 and 28, in plan view, the emitter contact holes CTE overlap with both the n-type semiconductor region NR and the emitter wirings M1E, while the base contact holes CTB overlap with both the p-type semiconductor region PR and the base wirings M1B. The emitter wirings M1E and the base wirings M1B are separated from each other and do not overlap each other in plan view. For example, for the case shown in FIG. 28, extended portions of the emitter wirings M1E and base wirings M1B are alternately disposed.

FIG. 29 is a top view of the semiconductor device CP, and shows an insulating film PA as the uppermost layer of the semiconductor device CP and the emitter bonding pad PDE and base bonding pad PDB.

The uppermost layer of the semiconductor device CP is the above-mentioned insulating film PA, and as shown in FIG. 29, the insulating film PA is provided with the emitter opening OPE and the base opening OPB. The emitter opening OPE and the base opening OPB pass through the insulating film PA. The emitter wiring M1E exposed from the emitter opening OPE forms the emitter bonding pad PDE, while the base wiring M1B exposed from the base opening OPB forms the base bonding pad PDB. To make the relationship between FIGS. 28 and 29 easily understood, FIG. 28 shows the positions of the emitter opening OPE and the base opening OPB by dotted lines.

Although not shown, the backside electrode BE is formed over the entire backside of the semiconductor device CP, that is, the entire backside of the semiconductor substrate SUB included in the semiconductor device CP. The emitter bonding pad PDE, the base bonding pad PDB, and the backside electrode BE can serve as external terminals (terminals for external coupling) of the semiconductor device CP.

FIGS. 25 to 29 illustrate one example of the chip layouts of the semiconductor device CP in this embodiment. However, the invention is not limited thereto, and various modifications and changes can be made to this example.

<Main Features and Effects>

The manufacturing process for the semiconductor device in this embodiment includes: a step of preparing the semiconductor substrate SUB; a step of forming the insulating film IL over the semiconductor substrate SUB; and a step of forming the opening OP in the insulating film IL. The term "opening OP and insulating film IL with the opening OP formed therein" as used herein corresponds to the above-mentioned opening OP1 and the above-mentioned insulating film IL1 with the opening OP1 formed therein; to the above-mentioned opening OP2 and the above-mentioned insulating film IL2 with the opening OP2 formed therein; and to the above-mentioned contact hole CT and the above-mentioned insulating film IL4 with the contact hole CT formed therein. Hereinafter, the step of forming the opening OP in the insulating film IL corresponds to the steps (steps shown in FIGS. 3 to 6) of forming the above-mentioned opening OP1 in the above-mentioned insulating film IL1, to the steps (steps shown in FIGS. 9 to 12) of forming the above-mentioned opening OP2 in the above-mentioned insulating film IL2, and to the steps (steps shown in FIGS. 17 to 20) of forming the above-mentioned contact holes CT in the above-mentioned insulating film IL4. That is, the technical idea regarding the step of forming the opening OP in the insulating film IL as described below is one that can be applied in common to the steps (steps shown in FIGS. 3 to 6) of forming the above-mentioned opening OP1 in the above-mentioned insulating film IL1, to the steps (steps shown in FIGS. 9 to 12) of forming the above-mentioned opening OP2 in the above-mentioned insulating film IL2, and to the steps (steps shown in FIGS. 17 to 20) of forming the above-mentioned contact holes CT in the above-mentioned insulating film IL4.

The steps of forming the opening OP in the insulating film IL include a step of forming a mask layer for formation of the opening OP over the insulating film IL, a first etching step of dry etching the insulating film IL thereafter, a second etching step of wet etching the insulating film IL, and a step of then removing the mask layer. When the opening OP corresponds to the above-mentioned opening OP1, the mask layer for formation of the opening OP corresponds to the above-mentioned resist pattern RE1. When the opening OP corresponds to the above-mentioned opening OP2, the mask layer for formation of the opening OP corresponds to the above-mentioned resist pattern RE2. When the opening OP corresponds to the above-mentioned contact holes CT, the mask layer for formation of the opening OP corresponds to the above-mentioned resist pattern RE3.

One of the main features of this embodiment is that the first etching step (dry etching step) is finished before the semiconductor substrate SUB (the epitaxial layer EP of the semiconductor substrate SUB) is exposed at the bottom of the opening OP, and that the second etching step (wet etching step) is finished after the semiconductor substrate SUB (the epitaxial layer EP of the semiconductor substrate SUB) is exposed at the bottom of the opening OP. This arrangement can suppress or prevent the damage to the semiconductor substrate SUB in forming the opening OP, and can also suppress or prevent the size or shape of the opening OP from deviating from the designed value. Therefore, the reliability or performance of the semiconductor device can be improved. Now, the manufacturing method for the semiconductor device will be specifically described.

When manufacturing a semiconductor device, an opening is formed in an insulating film formed over a semiconductor substrate in such a manner as to expose the semiconductor substrate from the opening through the insulating film in some cases. In this case, when the opening is formed only by the dry etching to cause the semiconductor substrate to be exposed at the bottom of the opening, the exposed semiconductor substrate might be damaged by the dry etching. The damage to the semiconductor substrate by the dry etching might cause crystal defects and the like in a damaged part of the semiconductor substrate, leading to the degradation in the performance and reliability of a semiconductor element formed at the semiconductor substrate. For this reason, to improve the performance and reliability of the semiconductor device as much as possible, the semiconductor substrate is desirably prevented from being damaged due to the dry etching when forming the opening in the semiconductor substrate.

The opening passing through the insulating film can be proposed to be formed only by wet etching. However, in this case, the wet etching is isotropic etching, and thus can etch the side surfaces of the opening. As a result, the planar size (area) of the formed opening might be much larger than that of the opening of the resist pattern used as the etching mask. Furthermore, variations in planar size (area) and shape of the formed opening tend to occur. For this reason, when the opening is formed only by the wet etching to pass through the insulating film, the planar size or shape of the formed opening might deviate from the designed value. This might lead to the reduction in the reliability of the semiconductor device. Further, this might also lead to the reduction in the manufacturing yield rate of the semiconductor devices. The etching rate of the wet etching is lower than that of the dry etching. When attempting to increase the etching rate of the wet etching, the etchant needs to be at a higher concentration. However, the high-concentrated etchant tends to vary the etching rate in the wet etching, thus degrading the controllability of etching. This makes it difficult to increase the etching rate in the wet etching. Thus, it takes much etching time to form the opening only by the wet etching in such a manner as to allow the opening to pass through the insulating film. Furthermore, the manufacturing time for the semiconductor device is increased to decrease a throughput.

In contrast, in this embodiment, after forming the mask layer for formation of the opening OP, first, the dry etching (first etching step) is performed, and then the wet etching (second etching step) is performed, thereby forming the opening OP in the insulating film IL. In this case, the dry etching step (first etching step) is finished before the semiconductor substrate SUB (here, the epitaxial layer EP of the semiconductor substrate SUB) is exposed at the bottom of the opening OP, and the wet etching step (second etching step) is then finished after the semiconductor substrate SUB (here, the epitaxial layer EP of the semiconductor substrate SUB) is exposed at the bottom of the opening OP. That is, the opening OP is formed by both the dry etching step and the wet etching step thereafter. In the dry etching step (first etching step), the semiconductor substrate SUB is not exposed, and in the wet etching step (second etching step), the semiconductor substrate SUB is exposed. Specifically, the wet etching step (second etching step) starts when the insulating film IL is maintained in the form of layer at the bottom of the opening OP with the semiconductor substrate SUB not exposed at the bottom of the opening OP, and ends when the semiconductor substrate SUB is exposed at the bottom of the opening OP. In other words, the semiconductor substrate SUB is exposed at the bottom of the opening OP during the wet etching step (second etching step).

With this arrangement, in the formation step of the opening OP, the semiconductor substrate SUB is not exposed at the bottom of the opening OP during the dry etching, which can avoid the damage to the semiconductor substrate SUB by the dry etching. Thus, the semiconductor substrate SUB can be prevented from being damaged by the dry etching when forming the opening OP.

In the formation step of the opening OP, during the wet etching, the semiconductor substrate SUB is exposed at the bottom of the opening OP. Thus, the surface of the semiconductor substrate SUB (here, the epitaxial layer EP of the semiconductor substrate SUB) exposed at the bottom of the opening OP is exposed to the etchant. However, in the wet etching, the etching progresses by a chemical reaction with the etchant and thus does not cause any physical impact. The etch selectivity of the insulating film IL to the semiconductor substrate SUB in the wet etching is enhanced more easily than that in the dry etching. Thus, the wet etching is advantageous over the dry etching in order to selectively etch the insulating film IL while suppressing or preventing the etching of the semiconductor substrate SUB. The wet etching is a method that can selectively remove the insulating film IL while preventing the damage to the semiconductor substrate SUB. Even though the wet etching is performed with the surface of the semiconductor substrate SUB exposed at the bottom of the opening OP, no physical impact is applied to the exposed semiconductor substrate SUB, which can suppress or prevent the etching of the exposed semiconductor substrate SUB. Therefore, the semiconductor substrate SUB is exposed not by the dry etching step (first etching step) but by the wet etching step (second etching step), whereby the damage to the semiconductor substrate SUB can be suppressed or prevented when forming the opening OP.

That is, if in the formation step of the opening OP, the semiconductor substrate SUB is exposed at the bottom of the opening OP during the dry etching, unlike this embodiment, the physical impact might be applied to the exposed semiconductor substrate SUB by the dry etching, thus damaging the semiconductor substrate SUB. For example, crystal defects might occur in the damaged part of the semiconductor substrate. This might reduce the performance and reliability of the semiconductor device. In contrast, in this embodiment, the semiconductor substrate SUB is exposed not in the dry etching step (first etching step) but in the wet etching step (second etching step), which can avoid the application of the physical impact onto the exposed semiconductor substrate SUB due to the dry etching, thereby suppressing or preventing the damage to the semiconductor substrate SUB when forming the opening OP. Therefore, the performance of the semiconductor device can be improved. Furthermore, the reliability of the semiconductor device can be improved.

Suppose that the opening OP is formed only by the wet etching step (second etching step) and not by the dry etching step (first etching step), unlike this embodiment. In this case, as mentioned above, the planar size or shape of the opening formed only by the wet etching step tends to deviate from the designed value, which might lead to the reduction in the reliability of the semiconductor device. Furthermore, when intended to form the opening OP only by the wet etching step, it will take a longer time to etch for formation of the opening, resulting in an increase in the manufacturing time of the semiconductor device, reducing the throughput.

In contrast, in this embodiment, the dry etching step (first etching step) is first performed, and the wet etching step (second etching step) is then performed, thereby forming the opening OP in the insulating film IL. Thus, in this embodiment, the thickness of the insulating film IL etched in the wet etching step can be made smaller, compared to the case of forming the opening OP in the insulating film IL only by the wet etching step. That is, even though the initial thickness of the insulating film IL is large in the region where the opening OP is to be formed, the dry etching step (first etching step) is first performed to enable thinning of the insulating film IL to some extent. Then, the insulating film IL has only to be wet etched in the wet etching step (second etching step) by its remaining thickness of the insulating film IL obtained after the dry etching step. In this embodiment, by first performing the dry etching step, the thickness of the insulating film IL to be etched in the subsequent wet etching step can be decreased. Thus, even though the insulating film IL is isotropically etched in the wet etching step, the amount of the wet etched part is not much, which can suppress or prevent the planar size or shape of the formed opening OP from deviating from the designed value. Because of this, the reliability of the semiconductor device can be improved. Therefore, the manufacturing yield rate of the semiconductor device can be improved.

To suppress or prevent the planar size or shape of the formed opening OP from deviating from the designed value, the first etching step (dry etching step) is preferably the anisotropic dry etching. In this regard, reactive ion etching can be suitably used.

This embodiment can suppress or prevent the planar size or shape of the formed opening OP from deviating from the designed value, which means that the planar size or shape of the opening OP can be formed to take the substantially designed value. Thus, the design margin can be decreased, which is advantageous in miniaturization (decreasing the area) of the semiconductor device. Further, the fine opening OP can also be formed, making it possible to handle fine patterns, which is also advantageous in miniaturization of elements.

In this embodiment, by previously performing the dry etching step, the thickness of the insulating film IL to be etched in the subsequent wet etching step can be decreased, thereby shortening the time required for the wet etching. The dry etching has a higher etching rate than the wet etching. Thus, in this embodiment, the time required for forming the opening OP can be shortened, compared to the case of forming an opening only by the wet etching step. Therefore, this embodiment can shorten the manufacturing time for the semiconductor device and can also improve the throughput.

Unlike this embodiment, suppose that the dry etching step (first etching step) is performed until the semiconductor substrate SUB is exposed at the bottom of the opening OP, followed by the wet etching step (second etching step). In this case, since the dry etching is performed with the surface of the semiconductor substrate SUB exposed at the bottom of the opening OP, in such a dry etching step, the semiconductor substrate exposed at the bottom of the opening OP is damaged by the dry etching. If the wet etching step is performed thereafter, the damage made by the dry etching is difficult to completely recover. Thus, the performance and reliability of the semiconductor device might be degraded due to such damage by the dry etching.

In contrast, considering the inconveniences caused due to the damage to the semiconductor substrate by the dry etching, this embodiment is configured to finish the dry etching step (first etching step) before the semiconductor substrate SUB is exposed at the bottom of the opening OP in order to avoid the damage itself to the semiconductor substrate by the dry etching. That is, the timing of finishing the dry etching step (first etching step) is important, and the dry etching step (first etching step) is finished not after the semiconductor substrate SUB is exposed at the bottom of the opening OP, but before the substrate SUB is exposed at the bottom of the opening OP. That is, the dry etching is designed not to be performed with the semiconductor substrate SUB exposed at the bottom of the opening OP. With this arrangement, the semiconductor substrate exposed at the bottom of the opening OP can be prevented from being damaged by the dry etching, thereby improving the performance and reliability of the semiconductor device.

In this way, in this embodiment, the opening OP is formed in the insulating film IL in the dry etching step (first etching step) and the subsequent wet etching step (second etching step). Furthermore, the dry etching step is finished before the semiconductor substrate SUB is exposed at the bottom of the opening OP, and the wet etching step is finished after the semiconductor substrate SUB is exposed at the bottom of the opening OP. This arrangement can suppress or prevent the damage to the semiconductor substrate SUB in forming the opening OP, and can also suppress or prevent the size or shape of the opening OP from deviating from the designed value. Thus, the reliability of the semiconductor device can be improved. Further, the performance of the semiconductor device can be improved.

Next, other features of this embodiment will be described.

As mentioned above, in this embodiment, by first performing the dry etching step, the thickness of the insulating film IL to be etched in the subsequent wet etching step can be decreased. Thus, the etching amount of the insulating film IL in the wet etching step can be decreased, thereby suppressing or preventing the planar size or shape of the formed opening OP from deviating from the designed value. However, when the etching amount of the insulating film IL in the dry etching step is a little, the etching amount of the insulating film IL in the wet etching step becomes more, which might reduce the effect of suppressing or preventing the planar size or shape of the opening OP from deviating from the designed value. For this reason, to decrease the etching amount of the insulating film IL in the wet etching step, the etching amount of the insulating film IL in the dry etching step is desirably increased to some extent.

In this embodiment, in the step of forming the opening OP in the insulating film IL, the etching amount (etching thickness) of the insulating film IL in the first etching step (dry etching step) is preferably equal to or more than the etching amount (etching thickness) of the insulating film IL in the second etching step (wet etching step). Thus, the amount of etching of the insulating film IL in the wet etching step can be restrained, thereby more reliably suppressing or preventing the planar size or shape of the opening OP from deviating from the designed value. Accordingly, the reliability of the semiconductor device can be improved more surely. Therefore, the manufacturing yield rate of the semiconductor device can be improved more adequately. The etching amount of the insulating film IL in the wet etching step can be restrained to more surely reduce the time required for the formation step of the opening OP. Note that the etching amount (etching thickness) of the insulating film IL corresponds to the etching amount (etching thickness) of the insulating film IL in the direction substantially perpendicular to the main surface of the semiconductor substrate SUB.

The formation step of the above-mentioned opening OP1 will be specifically described below. That is, the etching amount (etching thickness) E1 of the insulating film IL1 in the first etching step is preferably equal to or more than the etching amount (etching thickness) E2 of the insulating film IL1 in the second etching step (in short, $E1 \geq E2$). With this arrangement, the planar size or shape of the opening OP1 can be more reliably suppressed or prevented from deviating from the designed value, and the time required for the formation of the opening OP1 can be reduced more surely.

The formation step of the above-mentioned opening OP2 will be specifically described below. That is, the etching amount (etching thickness) E3 of the insulating film IL2 in the first etching step is preferably equal to or more than the etching amount (etching thickness) E4 of the insulating film IL2 in the second etching step (in short, $E3 \geq E4$). With this arrangement, the planar size or shape of the opening OP2 can be more reliably suppressed or prevented from deviating from the designed value, and the time required for the formation of the opening OP2 can also be reduced more surely.

The formation step of the above-mentioned contact holes CT (CTB, CTE) will be specifically described below. That is, in the region where the emitter contact hole CTE is to be formed, the etching amount (etching thickness) E5e of the insulating film IL4 in the first etching step is preferably equal to or more than the etching amount (etching thickness) E6e of the insulating film IL4 in the second etching step (in short, $E5e \geq E6e$). With this arrangement, the planar size or shape of the emitter contact hole CTE can be more reliably suppressed or prevented from deviating from the designed value, and the time required for the formation of the contact holes CT (CTE, CTB) can be reduced more surely.

Note that as mentioned above, the thickness T5e of the insulating film IL4 in the region where the emitter contact hole CTE is to be formed immediately before the first etching step is smaller than the thickness T5b of the insulating film IL4 in the region where the base contact hole CTB is to be formed immediately before the first etching step ($T5e < T5b$). In this case, the etching amount (etching thickness) of the insulating film IL4 in the first etching step is set equal to or more than the etching amount (etching thickness) of the insulating film IL4 in the second etching step. This technical feature is applied to the region where the emitter contact hole CTE is to be formed and in which the insulating film IL4 is relatively thin immediately before the first etching step. After the first etching step, the insulating film IL4 can remain in an appropriate thickness at the bottom of the emitter contact hole CTE, and also the insulating film IL4 can remain at the bottom of the base contact hole CTB without exposing the semiconductor substrate SUB therefrom. Note that for T5$e$<T5$b$, the remaining film thickness T6$b$ of the insulating film IL4 at the bottom of the base contact hole CTB immediately before the second etching step is larger than the remaining film thickness T6$e$ of the insulating film IL4 at the bottom of the emitter contact hole CTE immediately before the second etching step (T6$b$>T6$e$). Therefore, the case of E5$e$≥E6$e$ can take either the state in which the relationship of E5$b$≥E6$b$ is satisfied or the state in which the relationship of E5$b$≥E6$b$ is not satisfied.

In this embodiment, the first etching step (dry etching step) is finished before the semiconductor substrate SUB is exposed at the bottom of the opening OP, thereby preventing the damage to the semiconductor substrate SUB by the dry etching. However, when the insulating film IL remaining at the bottom of the opening OP is excessively thinned after the end of the first etching step (dry etching step), the etching amount of dry etching sometimes varies due to unintentional causes. In such a case, the semiconductor substrate SUB can be exposed at the bottom of the opening OP during the first etching step (dry etching step). When the semiconductor substrate SUB is exposed in the first etching step, the semiconductor substrate SUB might be damaged by the dry etching. Thus, it is desirable that even if the etching amount of the dry etching varies due to the unintentional causes, the insulating film IL surely remains at the bottom of the opening OP after the end of the first etching step (dry etching step), thereby preventing the exposure of the semiconductor substrate SUB.

For this reason, in this embodiment, the thickness of the insulating film IL remaining at the bottom of the opening OP in the stage where the first etching step (dry etching step) is finished is preferably equal to or more than one tenth (1/10) of the thickness of the insulating film IL in the region where the opening OP is to be formed in the stage before the first etching step (dry etching step). Thus, even if the etching amount of the first etching step varies slightly due to the unintentional causes, the insulating film IL can remain more surely at the bottom of the opening OP after the end of the first etching step, thereby preventing the exposure of the semiconductor substrate SUB. Further, even if the etching amount of the dry etching varies slightly due to the unintentional causes, the semiconductor substrate SUB can be more reliably prevented from being damaged at the bottom of the opening OP by the dry etching. Accordingly, the reliability and performance of the semiconductor device can be improved more surely. The etching amount of the dry etching is allowed to slightly vary because of the unintentional causes, which makes it easier to manage the manufacturing steps.

The formation step of the above-mentioned opening OP1 will be specifically described below. That is, the remaining film thickness T2 of the insulating film IL1 at the bottom of the opening OP1 immediately before the second etching step (that is, after the first etching step) is preferably equal to or more than one-tenth of the thickness T1 of the insulating film IL1 in the stage before the first etching step (T2≥T1×1/10). Because of this, even if the etching amount of the first etching step (dry etching step) varies slightly due to the unintentional causes, the semiconductor substrate SUB can be more surely prevented from being exposed at the bottom of the opening OP1, and thus can be more reliably prevented from being damaged by the dry etching.

The formation step of the above-mentioned opening OP2 will be specifically described below. That is, the remaining film thickness T4 of the insulating film IL2 at the bottom of the opening OP2 immediately before the second etching step (i.e., after the first etching step) is preferably equal to or more than one-tenth of the thickness T3 of the insulating film IL2 in the stage before the first etching step (T4≥T3×1/10). Thus, even if the etching amount of the first etching step (dry etching step) varies slightly due to the unintentional causes, the semiconductor substrate SUB can be more surely prevented from being exposed at the bottom of the opening OP2, and thus can be more reliably prevented from being damaged by the dry etching.

The formation step of the above-mentioned contact holes CT (CTB, CTE) will be specifically described below. That is, the remaining film thickness T6$e$ of the insulating film IL4 at the bottom of the emitter contact hole CTE immediately before the second etching step (i.e., after the first etching step) is preferably equal to or more than one-tenth of the thickness T5$e$ of the insulating film IL4 in the stage before the first etching step (T6$e$≥T5$e$×1/10). Thus, even if the etching amount of the first etching step (dry etching step) varies slightly due to the unintentional causes, the semiconductor substrate SUB can be more surely prevented from being exposed at the bottom of the emitter contact hole CTE, and thus can be more reliably prevented from being damaged by the dry etching.

The same goes for the base contact hole CTB. The remaining film thickness T6$b$ of the insulating film IL4 at the bottom of the base contact hole CTB immediately before the second etching step (i.e., after the first etching step) is preferably equal to or more than one-tenth of the thickness T5$b$ of the insulating film IL4 in the stage before the first etching step (T6$b$≥T5$b$×1/10). Note that when the relationship of T5$e$<T5$b$ is satisfied as mentioned above, the etching amount in the first etching step (dry etching step) is set to satisfy the relationship of T6$e$≥T5$e$×1/10, whereby the relationship of T6$b$≥T5$b$×1/10 is also satisfied inevitably.

In this embodiment, as mentioned above, in the step of forming the opening OP, after the first etching step (dry etching step) is first performed, then the second etching step (wet etching step) is performed. In this case, after the first etching step and before the second etching step, plasma processing is preferably performed using gas containing oxygen. Hereinafter, the plasma processing performed after the first etching step and before the second etching step is referred to as a "plasma processing step".

The plasma processing step performed between the first etching step and the second etching step is plasma processing using gas containing oxygen and is performed to improve the hydrophilicity of the inner surface (bottom surface and side surfaces) of the opening OP.

That is, in the first etching step of performing the dry etching, sediments including polymer might be deposited on the inner surface of the opening OP, thus reducing the hydrophilicity of the inner surface of the opening OP. In the second etching step of performing the wet etching, the etching of the insulating film IL progresses by a chemical reaction with the etchant. However, if the inner surface of the opening OP has the low-level hydrophilicity, that is, if the wettability of the etchant is low at the inner surface of the opening OP, the wet etching might not be carried out well, resulting in variations in the wet-etched state. Thus, in the wet etching, it is desirable to improve the hydrophilicity of the inner surface of the opening OP in advance.

For this reason, in this embodiment, in the step of forming the opening OP, the plasma processing (plasma processing step) using gas containing oxygen is preferably performed after the first etching step (dry etching step) and before the second etching step (wet etching step). The plasma processing step can remove the sediments (polymer and the like) deposited on the inner surface of the opening OP at the first etching step, thereby improving the hydrophilicity of the inner surface of the opening OP. Thus, the second etching step (wet etching step) can be performed with the hydrophilicity of the inner surface of the opening OP improved, so that the wettability of the etchant at the inner surface of the opening OP can be improved in the second etching step. Because of this, the second etching step (wet etching step) can be performed more surely, thus preventing the variations in the wet-etched state more reliably.

For this reason, in this embodiment, in any one or more of the step of forming the opening OP, the step of forming the opening OP2, and the step of forming the contact hole CT, the plasma processing (plasma processing step) using gas containing oxygen is preferably performed after the first etching step (dry etching step) and before the second etching step (wet etching step). Most preferably, in all of the steps of forming the opening OP1, the step of forming the opening OP2, and the step of forming the contact hole CT, the plasma processing (plasma processing step) using gas containing oxygen is preferably performed after the first etching step (dry etching step) and before the second etching step (wet etching step).

Note that the plasma processing step is the plasma processing using gas containing oxygen, but for example, oxygen plasma processing using oxygen gas can be suitably used. To remove the sediments generated by the dry etching, the oxygen plasma is effective. Gas suitable for use in the plasma processing step can include oxygen gas as a main component, and further additional gas added to the oxygen, such as fluorine gas, a compound gas containing fluorine, nitrogen gas, or steam gas etc.

Note that even by the plasma processing step, the semiconductor substrate SUB is not exposed at the bottom of the opening OP. That is, after the plasma processing step, the semiconductor substrate SUB is not exposed while the insulating film IL remains in the form of layer at the bottom of the opening OP. In this state, the second etching step (wet etching step) is adapted to start. Since the semiconductor substrate SUB is exposed at the bottom of the opening OP in the wet etching step, the above-mentioned effect of preventing the damage to the semiconductor device SUB can be surely obtained when forming the opening OP.

The plasma processing step is preferably performed with no bias voltage (bias power) applied to the semiconductor substrate SUB. By performing the plasma processing step with no bias voltage (bias power) applied to the semiconductor substrate SUB, the insulating film IL exposed from the opening OP can be suppressed or prevented from being etched in the plasma processing step. Thus, even after the plasm processing step, the state in which the semiconductor substrate SUB is not exposed at the bottom of the opening OP can be surely maintained. As a result, not the plasma processing step, but the sequent second etching step (wet etching step) can surely achieve the exposure of the semiconductor substrate SUB at the bottom of the opening OP, and hence the effect of preventing the damage to the semiconductor substrate SUB can be surely obtained when forming the opening OP as mentioned above.

On the other hand, the first etching step (dry etching step) is preferably performed with a bias voltage (bias power) applied to the semiconductor substrate SUB. Because of this, the etching rate in the first etching step (dry etching step) can be enhanced, thereby shortening the etching time for the first etching step (dry etching step). The time required for the formation of the opening can be shortened more. Therefore, this embodiment can shorten the manufacturing time for the semiconductor device and can also improve the throughput.

Thus, in the first etching step (dry etching step), the reactive ion etching is preferably performed.

In the steps of forming the opening OP in the insulating film IL, the first etching step (dry etching step) and the second etching step (wet etching step) are performed with the mask layer for formation of the opening OP formed over the insulating film IL. When performing the plasma processing step after the first etching step and before the second etching step, the mask layer for formation of the opening OP is adapted not to be removed by the plasma processing step. That is, the thickness of the formed mask layer for formation of the opening OP, the processing time of the plasma processing step, and the like are preferably set to maintain at least part of the thickness of the mask layer until the second etching step is finished. Thus, the second etching step can be performed with the mask layer for formation of the opening OP formed in the insulating film IL, thereby surely forming the opening OP in the insulating film IL. Note that the above-mentioned resist pattern RE1, resist pattern RE2, and resist pattern RE3 correspond to the mask layer for formation of the opening OP.

To improve the wettability of the etchant, it is also effective to add a surfactant agent to the etchant. That is, the addition of the surfactant agent to the etchant used in the second etching step can improve the wettability of the etchant at the inner surface of the opening OP in the second etching step. However, the addition of the surfactant agent in the etchant might increase variations in etching rate, degrading the controllability of the etching.

For this reason, the way to perform the plasma processing step between the first etching step and the second etching step is more preferable rather than the way to add the surfactant agent into the etchant used in the second etching step. Thus, in the second etching step, the wettability of the etchant at the inner surface of the opening OP can be improved, and the controllability of the wet etching can also be improved.

The insulating film IL suitable for use to form the opening OP is preferably a silicon oxide film. The silicon oxide film can ensure the high etching selectivity relative to the semiconductor substrate SUB (single crystal silicon). Thus, the use of the silicon oxide film as the insulating film IL forming the opening OP can more surely suppress or prevent the etching of the semiconductor substrate SUB when exposing the semiconductor substrate SUB at the bottom of the opening OP in the second etching step. When using the silicon oxide film as the insulating film IL forming the opening OP, the etchants suitable for use in the second etching step can include, for example, dilute hydrofluoric acid (a hydrofluoric acid aqueous solution, a buffered hydrofluoric acid, etc.) Further, when using the silicon oxide film as the insulating film IL forming the opening OP, the etching gas used in the first etching step can include, for example, gas of a compound containing fluorine (F). For example, the gas containing $CF_4$ can also be used as the etching gas.

Here, one example of the respective conditions for the first etching step, the plasma processing step, and the second etching step will be exemplified. The exemplified conditions are set on the assumption that the insulating film IL is the silicon oxide film. The following conditions can be changed depending on the initial film thickness of the insulating film IL, the expected etching rate and etching amount, and the like.

The first etching step (dry etching step) can be performed, for example, under the conditions below. That is, the pressure in a chamber is 1500 mTorr; a high-frequency power is 700 W; etching gas is a mixture of $CF_4$ gas and Ar gas; gas flow rates are 200 sccm for $CF_4$ gas and 1500 sccm for Ar gas; a wafer bias is 500 W; and a wafer stage temperature is about −10° C. Note that the term "wafer bias" as used herein means a bias voltage or a bias power applied to the semiconductor substrate.

The plasma processing step can be performed, for example, under the conditions below. That is, the pressure in a chamber is 300 mTorr; a high-frequency power is 700 W; a processing gas is a mixing gas of $O_2$ gas and $CF_4$ gas; a gas flow rate is 250 sccm for $O_2$ gas, and another gas flow rate for $CF_4$ gas is equal to or lower than that (e.g. 250 sccm) of $O_2$; a wafer bias is 0 W (zero watt); and a wafer stage temperature is about 50° C. or lower.

The second etching step (wet etching step) can use, for example, buffered hydrofluoric acid (BHF).

Under the conditioned exemplified herein, in the first etching step, the etching gas contains $CF_4$ gas, and the wafer bias is applied, which promotes the etching of the silicon oxide film (insulating film IL). On the other hand, in the plasma processing step, the processing gas contains $CF_4$ gas, but no wafer bias is applied, whereby the silicon oxide film (insulating film IL) is not etched so much.

The decrease in thickness of the resist pattern (corresponding to the above-mentioned resist patterns RE1, RE2, and RE3) in the plasma processing step is preferably 200 nm or less, and more preferably 50 nm or less.

The formation step of the above-mentioned p-type semiconductor region PR and the formation step of the above-mentioned n-type semiconductor region NR will be described supplementarily.

The p-type semiconductor region PR for the base is preferably formed by ion implantation because of its considerable depth. Thus, the p-type semiconductor region PR can be formed easily and reliably.

On the other hand, the above-mentioned n-type semiconductor region NR for the emitter can be formed by thermally diffusing the n-type impurities into the semiconductor substrate SUB from the above-mentioned n-type impurity-containing film PS as it is shallower than the p-type semiconductor region PR. The n-type impurities are thermally diffused from the n-type impurity-containing film PS into the semiconductor substrate SUB to form the n-type semiconductor region NR, thereby avoiding the ion implantation in the formation step of the n-type semiconductor region NR. Thus, when forming the n-type semiconductor region NR, the semiconductor substrate SUB is not damaged by the ion implantation, which can prevent the crystal defects that would be caused due to the damage by the ion implantation. The n-type semiconductor region NR can be formed by the ion implantation. However, to suppress the leak current from the surface of the semiconductor substrate SUB in the manufactured semiconductor device, it is desirable to suppress defects near the surface of the semiconductor substrate SUB as much as possible. For this reason, the formation of the n-type semiconductor region NR by the thermal diffusion of the n-type impurities from the n-type impurity-containing film PS is more preferable than the formation by the ion implantation. With this arrangement, the leak current can be suppressed at the surface of the semiconductor substrate SUB in the manufactured semiconductor device.

When not forming the NPN type bipolar transistor but a PNP type bipolar transistor, the p-type semiconductor region is formed instead of the above-mentioned n-type semiconductor region NR, as the semiconductor region for the emitter. In such a case, a p-type impurity-containing film that contains p-type impurities, such as boron (B), (in a high concentration) may be used in place of the above-mentioned n-type impurity-containing film PS. The p-type impurity-containing film can be formed, for example, by a polyboron film (PBF) and the like.

In this embodiment, the manufacturing steps for the semiconductor device including the bipolar transistor have been described above with reference to FIGS. 1 to 24. The bipolar transistor as described herein is a vertical transistor (vertical bipolar transistor) in which the emitter region, the base region, and the collector region are arranged in the vertical direction (in the direction substantially vertical to the main surface of the semiconductor substrate SUB) to allow the current (collector current) to flow at the main surface of the semiconductor substrate in the substantially vertical direction. Unlike this embodiment, when exposing the semiconductor substrate SUB at the bottom of the opening OP in the dry etching step, the damage (crystal defects and the like) occurs in the longitudinal direction at the semiconductor substrate SUB exposed at the bottom of the opening OP by the dry etching. Compared to a lateral transistor for allowing the current (channel current) to flow in the direction substantially parallel to the main surface of the semiconductor substrate, the damage caused at the semiconductor substrate in the longitudinal direction (crystal defects and the like) significantly affects the transistor characteristics in the vertical transistor for allowing the current to flow in the direction substantially vertical to the main surface of the semiconductor substrate. Thus, the formation step of the opening OP in this embodiment can prevent the damage (crystal defects and the like) to the semiconductor substrate in the longitudinal direction due to the dry etching. Accordingly, this formation step is applied to the manufacture of the semiconductor device having the vertical transistor (especially, the vertical bipolar transistor), and its effect is extremely significant.

In the bipolar transistor, the control of the surface state of the semiconductor substrate is very important in terms of the device characteristics. Further, it is desirable to suppress the damage (crystal defects and the like) to the vicinity of the surface of the semiconductor substrate as much as possible. The formation method of the opening OP in this embodiment, which can prevent the damage (crystal defects and the like) to the semiconductor substrate at the bottom of the opening OP, is applied to the manufacture of the semiconductor device including the bipolar transistor, and thus its effect is significant.

A semiconductor region is sometimes formed by introducing impurities into the semiconductor substrate SUB exposed from the opening OP of the insulating film IL after the formation step of the opening OP. In such a case, the formation step of the opening OP according to this embodiment can be applied to form the semiconductor region at the region of the substrate not damaged by the dry etching, which can prevent the degradation in the performance and reliability of the semiconductor element with the semiconductor region due to the damage to the substrate by the dry etching. This effect is extremely significant when the semiconductor region is a semiconductor region for the emitter of the bipolar transistor (corresponding to the above-mentioned n-type semiconductor region NR), or a semiconductor region for the base (corresponding to the above-mentioned p-type semiconductor region PR).

The present invention made by the inventors has been specifically described above on the basis of the embodiments. It is apparent that the present invention is not limited to the embodiments described above, and that various modifications and changes can be made to these embodiments without departing from the spirit and scope of the invention.

What is claimed is:

1. A method for manufacturing a semiconductor device, comprising:
   (a) forming an insulating film over a semiconductor substrate, the insulating film having a top and a bottom and being formed of a single layer of insulating material extending from the top to the bottom; and
   (b) forming an opening in the insulating film, wherein (b) comprises:
      (b1) forming, over the insulating film, a mask layer for formation of the opening;
      (b2) after (b1), dry etching the insulating film from the top to an intermediate region within the insulating film;
      (b3) after (b2), performing plasma processing using gas containing oxygen;
      (b4) after (b3), wet etching the insulating film from the intermediate region to the bottom of the insulating film; and
      (b5) after (b4), removing the mask layer,
   wherein (b3) is performed while no bias voltage is applied to the semiconductor substrate,
   wherein the dry etching of (b2) is completed without exposing the semiconductor substrate at a bottom of the opening, and
   wherein after the wet etching of (b4) the semiconductor substrate is exposed at the bottom of the opening.

2. The method for manufacturing a semiconductor device of claim 1,
   wherein a first etching amount from the top to the intermediate region of the insulating film in (b2) is equal to or more than a second etching amount from the intermediate region to the bottom of the insulating film in (b4).

3. The method for manufacturing a semiconductor device of claim 2,
   wherein a first thickness from the intermediate region to the bottom of the insulating film that remains after (b2) and before (b4) is equal to or more than one-tenth of a second thickness from the top to the bottom of the insulating film prior to (b2).

4. The method for manufacturing a semiconductor device of claim 1,
   wherein after (b3) and before (b4), the semiconductor substrate is not yet exposed by the opening.

5. The method for manufacturing a semiconductor device of claim 1,
   wherein (b2) is performed while a bias voltage is applied to the semiconductor substrate.

6. The method for manufacturing a semiconductor device of claim 1, further comprising:
   (c) after (b), forming a first semiconductor region at an upper surface of the semiconductor substrate by introducing impurities into the semiconductor substrate exposed from the opening of the insulating film.

7. The method for manufacturing a semiconductor device of claim 6,
   wherein the first semiconductor region serves as a base or an emitter of a bipolar transistor.

8. The method for manufacturing a semiconductor device of claim 6, wherein (c) comprises:
   forming an impurity-containing film over the top of the insulating film and in the opening such that the impurity-containing film is in contact with the upper surface of the semiconductor substrate; and
   performing a heat treatment such that the impurities are introduced from the impurity-containing film into the semiconductor substrate via thermal diffusion so as to form the first semiconductor region.

9. The method for manufacturing a semiconductor device of claim 6, wherein (d) comprises:
   ion-implanting the impurities into the semiconductor substrate using the insulating film as a mask.

10. The method for manufacturing a semiconductor device of claim 1, further comprising, before (a):
    forming a first semiconductor region and a second semiconductor region in the semiconductor substrate,
    wherein in (b), the opening is formed over and connecting to one of the first semiconductor and second semiconductor regions.

11. The method for manufacturing a semiconductor device of claim 10,
    wherein the first and second semiconductor regions are formed at an upper surface of the substrate,
    wherein the first and second semiconductor regions serve as a base and an emitter, respectively, of a bipolar transistor, and
    wherein the first and second semiconductor regions overlap in a plan view.

12. The method for manufacturing a semiconductor device of claim 1,
    wherein the single layer of insulating material is silicon oxide.

13. The method for manufacturing a semiconductor device of claim 1,
    wherein the plasma processing of (b3) is effective to remove particulate resulting from the dry etching of (b2).

14. A method for manufacturing a semiconductor device, comprising:
    (0) forming a first semiconductor region and a second semiconductor region in the semiconductor substrate,
    (a) after (0), forming an insulating film over a semiconductor substrate, the insulating film having a top and a bottom and being formed of a single layer of insulating material extending from the top to the bottom;
    (b) forming an opening in the insulating film, wherein (b) comprises:
       (b1) forming, over the insulating film, a mask layer for formation of the opening;
       (b2) after (b1), dry etching the insulating film from the top to an intermediate region within the insulating film;
       (b3) after (b2), performing plasma processing using gas containing oxygen;
       (b4) after (b3), wet etching the insulating film from the intermediate region to the bottom of the insulating film; and
       (b5) after (b4), removing the mask layer; and
    (c) after (b), embedding a conductive film in the opening,
    wherein in (b), the opening is formed over and connecting to one of the first semiconductor and second semiconductor regions, wherein the dry etching of (b2) is completed without exposing the semiconductor substrate at a bottom of the opening, and wherein after the wet etching of (b4) the semiconductor substrate is exposed at the bottom of the opening.

15. The method for manufacturing a semiconductor device of claim 14, wherein a first etching amount from the top to the intermediate region of the insulating film in (b2) is equal to or more than a second etching amount from the intermediate region to the bottom of the insulating film in (b4).

16. The method for manufacturing a semiconductor device of claim 15, wherein a first thickness from the intermediate region to the bottom of the insulating film that remains after (b2) and before (b4) is equal to or more than one-tenth of a second thickness from the top to the bottom of the insulating film prior to (b2).

17. The method for manufacturing a semiconductor device of claim 14, wherein (b3) is performed while no bias voltage is applied to the semiconductor substrate.

18. The method for manufacturing a semiconductor device of claim 14, wherein the first and second semiconductor regions are formed at an upper surface of the substrate, wherein the first and second semiconductor regions serve as a base and an emitter, respectively, of a bipolar transistor, and wherein the first and second semiconductor regions overlap in a plan view.

19. The method for manufacturing a semiconductor device of claim 14, wherein the single layer of insulating material is silicon oxide.

20. The method for manufacturing a semiconductor device of claim 14, wherein the plasma processing of (b3) is effective to remove particulate resulting from the dry etching of (b2).

* * * * *